United States Patent
Rasjki et al.

(10) Patent No.: US 9,664,739 B2
(45) Date of Patent: *May 30, 2017

(54) CONTINUOUS APPLICATION AND DECOMPRESSION OF TEST PATTERNS AND SELECTIVE COMPACTION OF TEST RESPONSES

(71) Applicant: Mentor Graphics Corporation, Wilsonville, OR (US)

(72) Inventors: Janusz Rasjki, West Linn, OR (US); Jerzy Tyszer, Poznan (PL); Mark Kassab, Wilsonville, OR (US); Nilanjan Mukherjee, Wilsonville, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/853,412

(22) Filed: Sep. 14, 2015

(65) Prior Publication Data

US 2016/0003907 A1   Jan. 7, 2016

Related U.S. Application Data

(60) Continuation of application No. 14/021,800, filed on Sep. 9, 2013, now Pat. No. 9,134,370, which is a
(Continued)

(51) Int. Cl.
*G01R 31/3183* (2006.01)
*G01R 31/3185* (2006.01)

(52) U.S. Cl.
CPC ........ *G01R 31/318385* (2013.01); *G01R 31/318547* (2013.01)

(58) Field of Classification Search
CPC ........ G01R 31/318547; G01R 31/3177; G01R 31/318335; G01R 31/318385;
(Continued)

(56) References Cited

U.S. PATENT DOCUMENTS 519,078 A   5/1894   Wilson
713,605 A   11/1902  Churchward
(Continued)

FOREIGN PATENT DOCUMENTS

EP   0 108 256   5/1984
EP   0 372 226   6/1990
(Continued)

OTHER PUBLICATIONS

Aitken et al., "A Diagnosis Method Using Pseudo-Random Vectors Without Intermediate Signatures," *Proc. ICCAD*, pp. 574-577 (1989).
(Continued)

*Primary Examiner* — Cynthia Britt
(74) *Attorney, Agent, or Firm* — Klarquist Sparkman, LLP

(57) ABSTRACT

A method for applying test patterns to scan chains in a circuit-under-test. The method includes providing a compressed test pattern of bits; decompressing the compressed test pattern into a decompressed test pattern of bits as the compressed test pattern is being provided; and applying the decompressed test pattern to scan chains of the circuit-under-test. The actions of providing the compressed test pattern, decompressing the compressed test pattern, and applying the decompressed pattern are performed synchronously at the same or different clock rates, depending on the way in which the decompressed bits are to be generated. A circuit that performs the decompression includes a decompressor such as a linear finite state machine adapted to receive a compressed test pattern of bits. The decompressor decompresses the test pattern into a decompressed test pattern of bits as the compressed test pattern is being received.

11 Claims, 22 Drawing Sheets

Related U.S. Application Data division of application No. 13/013,712, filed on Jan. 25, 2011, now Pat. No. 8,533,547, which is a continuation-in-part of application No. 12/891,498, filed on Sep. 27, 2010, now Pat. No. 8,108,743, which is a continuation of application No. 12/396,377, filed on Mar. 2, 2009, now Pat. No. 7,805,649, which is a continuation of application No. 10/973,522, filed on Oct. 25, 2004, now Pat. No. 7,500,163, which is a continuation of application No. 10/354,576, filed on Jan. 29, 2003, now Pat. No. 6,829,740, which is a continuation of application No. 09/619,988, filed on Jul. 20, 2000, now Pat. No. 6,557,129, application No. 14/853,412, which is a continuation of application No. 14/021,800, which is a division of application No. 13/013,712, which is a continuation-in-part of application No. 12/352,994, filed on Jan. 13, 2009, now Pat. No. 7,877,656, which is a continuation of application No. 10/354,633, filed on Jan. 29, 2003, now Pat. No. 7,478,296, which is a continuation of application No. 09/620,021, filed on Jul. 20, 2000, now Pat. No. 7,493,540, application No. 14/853,412, which is a continuation of application No. 14/021,800, which is a division of application No. 13/013,712, which is a continuation-in-part of application No. 12/983,815, filed on Jan. 3, 2011, now abandoned, which is a continuation of application No. 12/402,880, filed on Mar. 12, 2009, now Pat. No. 7,865,794, which is a continuation of application No. 11/502,655, filed on Aug. 11, 2006, now Pat. No. 7,506,232, which is a continuation of application No. 10/736,966, filed on Dec. 15, 2003, now Pat. No. 7,093,175, which is a continuation of application No. 09/713,664, filed on Nov. 15, 2000, now Pat. No. 6,684,358, application No. 14/853,412, which is a continuation of application No. 14/021,800, which is a division of application No. 13/013,712, which is a continuation-in-part of application No. 11/894,393, filed on Aug. 20, 2007, now Pat. No. 8,024,387, which is a continuation of application No. 10/781,031, filed on Feb. 17, 2004, now Pat. No. 7,260,591, which is a continuation of application No. 10/346,699, filed on Jan. 16, 2003, now Pat. No. 6,708,192, which is a continuation of application No. 09/957,701, filed on Sep. 18, 2001, now Pat. No. 6,539,409, which is a continuation of application No. 09/620,023, filed on Jul. 20, 2000, now Pat. No. 6,353,842, application No. 14/853,412, which is a continuation of application No. 14/021,800, which is a division of application No. 13/013,712, which is a continuation-in-part of application No. 12/405,409, filed on Mar. 17, 2009, now Pat. No. 7,900,104, which is a continuation of application No. 11/523,111, filed on Sep. 18, 2006, now Pat. No. 7,509,546, which is a continuation of application No. 10/355,941, filed on Jan. 31, 2003, now Pat. No. 7,111,209, which is a continuation of application No. 09/947,160, filed on Sep. 4, 2001, now Pat. No. 6,543,020, which is a continuation of application No. 09/619,985, filed on Jul. 20, 2000, now Pat. No. 6,327,687.

(60) Provisional application No. 60/167,136, filed on Nov. 23, 1999, provisional application No. 60/167,131, filed on Nov. 23, 1999, provisional application No. 60/167,137, filed on Nov. 23, 1999, provisional application No. 60/167,445, filed on Nov. 23, 1999, provisional application No. 60/167,446, filed on Nov. 23, 1999.

(58) Field of Classification Search
CPC ...... G01R 31/318594; G01R 31/31921; G01R 31/2815; H03M 7/30; G06F 7/584
USPC .............................. 714/726, 729, 731, 732
See application file for complete search history.

(56) References Cited

U.S. PATENT DOCUMENTS

| | | |
|---|---|---|
| 3,614,400 A | 10/1971 | Farnett |
| 3,700,869 A | 10/1972 | Low et al. |
| 4,024,460 A | 5/1977 | Vifian |
| 4,122,399 A | 10/1978 | Heiter et al. |
| 4,161,041 A | 7/1979 | Butler et al. |
| 4,320,509 A | 3/1982 | Davidson |
| 4,503,537 A | 3/1985 | McAnney |
| 4,513,418 A | 4/1985 | Bardell, Jr. et al. |
| 4,536,881 A | 8/1985 | Kasuya |
| 4,602,210 A | 7/1986 | Fasang et al. |
| 4,687,988 A | 8/1987 | Eichelberger et al. |
| 4,754,215 A | 6/1988 | Kawai |
| 4,785,410 A | 11/1988 | Hamatsu et al. |
| 4,801,870 A | 1/1989 | Eichelberger et al. |
| 4,827,476 A | 5/1989 | Garcia |
| 4,860,236 A | 8/1989 | McLeod et al. |
| 4,910,735 A | 3/1990 | Yamashita |
| 4,959,832 A | 9/1990 | Bardell, Jr. |
| 4,974,184 A | 11/1990 | Avra |
| 5,072,178 A | 12/1991 | Matsumoto |
| 5,090,035 A | 2/1992 | Murase |
| 5,138,619 A | 8/1992 | Fasang et al. |
| 5,167,034 A | 11/1992 | MacLean, Jr. et al. |
| 5,173,906 A | 12/1992 | Dreibelbis et al. |
| 5,202,889 A | 4/1993 | Aharon et al. |
| 5,258,986 A | 11/1993 | Zerbe |
| 5,268,949 A | 12/1993 | Watanabe et al. |
| 5,293,123 A | 3/1994 | Jordan et al. |
| 5,301,199 A | 4/1994 | Ikenaga et al. |
| 5,325,367 A | 6/1994 | Dekker et al. |
| 5,349,587 A | 9/1994 | Nadeau-Dostie et al. |
| 5,369,648 A | 11/1994 | Nelson |
| 5,394,405 A | 2/1995 | Savir |
| 5,412,665 A | 5/1995 | Gruodis et al. |
| 5,414,716 A | 5/1995 | Bershteyn |
| 5,416,783 A | 5/1995 | Broseghini et al. |
| 5,444,716 A | 8/1995 | Jarwala et al. |
| 5,446,683 A | 8/1995 | Mullen et al. |
| 5,450,414 A | 9/1995 | Lin |
| 5,524,114 A | 6/1996 | Peng |
| 5,533,128 A | 7/1996 | Vobach |
| 5,553,082 A | 9/1996 | Connor et al. |
| 5,574,733 A | 11/1996 | Kim |
| 5,586,125 A | 12/1996 | Warner |
| 5,588,006 A | 12/1996 | Nozuyama |
| 5,592,493 A | 1/1997 | Crouch et al. |
| 5,608,870 A | 3/1997 | Valiant |
| 5,612,963 A | 3/1997 | Koenemann et al. |
| 5,614,838 A | 3/1997 | Jaber et al. |
| 5,617,531 A | 4/1997 | Crouch et al. |
| 5,631,913 A | 5/1997 | Maeda |
| 5,642,362 A | 6/1997 | Savir |
| 5,663,966 A | 9/1997 | Day et al. |
| 5,668,817 A | 9/1997 | Adham |
| 5,680,543 A | 10/1997 | Bhawmik |
| 5,694,401 A | 12/1997 | Gibson |
| 5,694,402 A | 12/1997 | Butler et al. |
| 5,701,308 A | 12/1997 | Attaway et al. |
| 5,701,309 A | 12/1997 | Gearhardt et al. |
| 5,717,701 A | 2/1998 | Angelotti et al. |
| 5,717,702 A | 2/1998 | Stokes et al. |
| 5,719,913 A | 2/1998 | Maeno |
| 5,748,497 A | 5/1998 | Scott et al. |
| 5,761,489 A | 6/1998 | Broseghini et al. |

(56) References Cited

U.S. PATENT DOCUMENTS

| | | |
|---|---|---|
| 5,790,562 A | 8/1998 | Murray et al. |
| 5,790,626 A | 8/1998 | Johnson et al. |
| 5,812,561 A | 9/1998 | Giles et al. |
| 5,831,992 A | 11/1998 | Wu |
| 5,848,198 A | 12/1998 | Penn |
| 5,867,507 A | 2/1999 | Beebe et al. |
| 5,870,476 A | 2/1999 | Fischer |
| 5,872,793 A | 2/1999 | Attaway et al. |
| 5,883,906 A | 3/1999 | Turnquist et al. |
| 5,899,961 A | 5/1999 | Sundermann |
| 5,905,986 A | 5/1999 | Rohrbaugh et al. |
| 5,938,784 A | 8/1999 | Kim |
| 5,945,875 A | 8/1999 | Zhou et al. |
| 5,968,194 A | 10/1999 | Wu et al. |
| 5,974,179 A | 10/1999 | Caklovic |
| 5,974,433 A | 10/1999 | Currie |
| 5,983,380 A | 11/1999 | Motika et al. |
| 5,991,898 A | 11/1999 | Rajski et al. |
| 5,991,909 A | 11/1999 | Rajski et al. |
| 6,006,349 A | 12/1999 | Fujisaki |
| 6,014,763 A | 1/2000 | Dhong et al. |
| 6,021,513 A | 2/2000 | Beebe et al. |
| 6,026,508 A | 2/2000 | Craft |
| 6,029,263 A | 2/2000 | Gibson |
| 6,041,429 A | 3/2000 | Koenemann |
| 6,055,658 A | 4/2000 | Jaber et al. |
| 6,061,818 A | 5/2000 | Touba et al. |
| 6,072,823 A | 6/2000 | Takakusaki |
| 6,100,716 A | 8/2000 | Adham et al. |
| 6,122,761 A | 9/2000 | Park |
| 6,141,669 A | 10/2000 | Carleton |
| 6,148,425 A | 11/2000 | Bhawmik et al. |
| 6,158,032 A | 12/2000 | Currier et al. |
| 6,178,532 B1 | 1/2001 | Pierce et al. |
| 6,181,164 B1 | 1/2001 | Miller |
| 6,199,182 B1 | 3/2001 | Whetsel |
| 6,240,432 B1 | 5/2001 | Chuang et al. |
| 6,256,759 B1 | 7/2001 | Bhawmik et al. |
| 6,256,760 B1 | 7/2001 | Carron et al. |
| 6,272,653 B1 | 8/2001 | Amstutz |
| 6,286,119 B1 | 9/2001 | Wu et al. |
| 6,300,885 B1 | 10/2001 | Davenport et al. |
| 6,308,291 B1 | 10/2001 | Kock et al. |
| 6,327,685 B1 | 12/2001 | Koprowski et al. |
| 6,327,687 B1 | 12/2001 | Rajski et al. |
| 6,330,681 B1 | 12/2001 | Cote et al. |
| 6,353,842 B1 | 3/2002 | Rajski et al. |
| 6,385,750 B1 | 5/2002 | Kapur et al. |
| 6,463,560 B1 | 10/2002 | Bhawmik et al. |
| 6,467,058 B1 | 10/2002 | Chakradhar et al. |
| 6,510,398 B1 | 1/2003 | Kundu et al. |
| 6,539,409 B2 | 3/2003 | Rajski et al. |
| 6,543,020 B2 | 4/2003 | Rajski et al. |
| 6,557,129 B1 | 4/2003 | Rajski et al. |
| 6,590,929 B1 | 7/2003 | Williams |
| 6,611,933 B1 | 8/2003 | Koenemann et al. |
| 6,618,826 B1 | 9/2003 | Chen et al. |
| 6,661,839 B1 | 12/2003 | Ishida et al. |
| 6,684,358 B1 | 1/2004 | Rajski et al. |
| 6,694,466 B1 | 2/2004 | Tsai et al. |
| 6,708,192 B2 | 3/2004 | Rajski et al. |
| 6,763,488 B2 | 7/2004 | Whetsel |
| 6,829,740 B2 | 12/2004 | Rajski et al. |
| 6,874,109 B1 | 3/2005 | Rajski et al. |
| 7,001,461 B2 | 2/2006 | Taniguchi et al. |
| 7,093,175 B2 | 8/2006 | Rajski et al. |
| 7,111,209 B2 | 9/2006 | Rajski et al. |
| 7,188,286 B2 | 3/2007 | Dervisoglu et al. |
| 7,197,681 B2 | 3/2007 | Dervisoglu et al. |
| 7,260,591 B2 | 8/2007 | Rajski et al. |
| 7,263,641 B2 | 8/2007 | Rajski et al. |
| 7,478,296 B2 | 1/2009 | Rajski et al. |
| 7,493,540 B1 | 2/2009 | Rajski et al. |
| 7,500,163 B2 | 3/2009 | Rajski et al. |
| 7,506,232 B2 | 3/2009 | Rajski et al. |
| 7,509,546 B2 | 3/2009 | Rajski et al. |
| 7,509,550 B2 | 3/2009 | Rajski et al. |
| 7,523,372 B2 | 4/2009 | Rajski et al. |
| 7,563,641 B2 | 7/2009 | Wang et al. |
| 7,610,539 B2 | 10/2009 | Balakrishnan et al. |
| 7,610,540 B2 | 10/2009 | Balakrishnan et al. |
| 7,653,851 B2 | 1/2010 | Rajski et al. |
| 7,805,649 B2 | 9/2010 | Rajski et al. |
| 7,805,651 B2 | 9/2010 | Rajski et al. |
| 7,865,794 B2 | 1/2011 | Rajski et al. |
| 7,877,656 B2 | 1/2011 | Rajski et al. |
| 7,900,104 B2 | 3/2011 | Rajski et al. |
| 8,024,387 B2 | 9/2011 | Rajski et al. |
| 8,108,743 B2 | 1/2012 | Rajski et al. |
| 8,533,547 B2 | 9/2013 | Rajski et al. |
| 2002/0112199 A1 | 8/2002 | Whetsel |
| 2002/0124217 A1 | 9/2002 | Hiraide et al. |
| 2003/0120988 A1 | 6/2003 | Rajski et al. |
| 2003/0131298 A1 | 7/2003 | Rajski et al. |
| 2004/0128599 A1 | 7/2004 | Rajski et al. |
| 2004/0172431 A1 | 9/2004 | Rajski et al. |
| 2005/0015688 A1 | 1/2005 | Rajski et al. |
| 2005/0097419 A1 | 5/2005 | Rajski et al. |

FOREIGN PATENT DOCUMENTS

| | | |
|---|---|---|
| EP | 0 438 322 | 7/1991 |
| EP | 0 481 097 | 4/1992 |
| EP | 0 549 949 | 3/1998 |
| EP | 0 887 930 | 12/1998 |
| EP | 1 242 885 | 9/2002 |
| EP | 1 256 008 | 11/2002 |
| EP | 1 256 008 B1 | 8/2006 |
| EP | 1 722 246 A2 | 11/2006 |
| EP | 1 256 007 | 6/2008 |
| EP | 2 146 212 | 1/2010 |
| JP | 63-286780 | 11/1988 |
| JP | 01-239486 | 9/1989 |
| JP | 03-2579 | 1/1991 |
| JP | 03-012573 | 1/1991 |
| JP | 4-236378 | 8/1992 |
| JP | 05-215816 | 8/1993 |
| JP | 05-249197 | 9/1993 |
| JP | 07-174822 | 7/1995 |
| JP | 07-198791 | 8/1995 |
| JP | 08-015382 | 1/1996 |
| JP | 9-130378 | 5/1997 |
| JP | 11-006852 | 1/1999 |
| JP | 11-030646 | 2/1999 |
| JP | 11-153655 | 6/1999 |
| JP | 11-174126 | 7/1999 |
| JP | 11-264860 | 9/1999 |
| JP | 2003-526778 | 9/2003 |
| JP | 2004-500558 | 1/2004 |
| JP | 2006-078493 | 3/2006 |
| JP | 3845016 | 8/2006 |
| JP | 4047584 | 11/2007 |
| WO | WO 91/10182 | 7/1991 |
| WO | WO 01/38889 | 5/2001 |
| WO | WO 01/38890 | 5/2001 |
| WO | WO 01/38891 | 5/2001 |
| WO | WO 01/38955 | 5/2001 |
| WO | WO 01/38981 | 5/2001 |
| WO | WO 01/39254 | 5/2001 |

OTHER PUBLICATIONS

Bardell, "Design Considerations for Parallel Pseudorandom Pattern Generators", *Journal of Electronic Testing: Theory and Applications*, vol. 1, pp. 73-87 (1990).

Bardell et al., "Pseudorandom arrays for built-in tests," *IEEE Trans. on Computers*, vol. C-35, No. 7, pp. 653-658 (1986).

Bardell et al., "Pseudorandom Sequence Generators," in *Built in test for VLSI: Pseudorandom Techniques*, Chapter 3, pp. 61-88 (1987).

Bardell et al., "Test Response Compression Techniques," in *Built-In Test for VLSI Pseudorandom Techniques*, Chapter 4, pp. 89-108 (1987).

(56) References Cited

OTHER PUBLICATIONS

Bassett et al., "Low-Cost Testing of High-Density Logic Components," *IEEE Design & Test of Computers*, pp. 15-28 (Apr. 1990).
Benowitz et al., "An Advanced Fault Isolation System for Digital Logic," IEEE Trans. on Computers, vol. C-24, No. 5, pp. 489-497 (May 1975).
Bershteyn, "Calculation of Multiple Sets of Weights for Weighted Random Testing," *Proc. ITC*, pp. 1031-1040 (1993).
Bhattacharya et al., "Zero-Aliasing Space Compression using a Single Periodic Output and its Application to Testing of Embedded Cores," *VLSI Design*, 6 pp. (Jan. 2000).
Chakrabarty et al., "Design of Built-In Test Generator Circuits Using Width Compression," *IEEE Trans. on Computer-Aided Design of Integrated Circuits and Systems*, vol. 17, No. 10, pp. 1044-1051 (Oct. 1998).
Chakrabarty et al., "Optimal space compaction of test responses," *Proc. ITC*, pp. 834-843 (1995).
Chakrabarty et al., "Optimal Zero-Aliasing Space Compaction of Test Responses," *IEEE Trans. on Computers*, vol. 47, No. 11, pp. 1171-1187 (Nov. 1998).
Chakrabarty et al., "Test response compaction using multiplexed parity trees," *IEEE Transactions CAD of Integrated Circuits and Systems*, vol. CAD-15, No. 11, pp. 1399-1408 (1996).
Chakrabarty et al., "Test Width Compression for Built-In Self Testing," *Proc. ITC*, pp. 328-337 (Nov. 1997).
Chakrabarty, "Zero-Aliasing Space Compaction Using Linear Compactors With Bounded Overhead," *IEEE Transactions on CAD of Integrated Circuits and Systems*, vol. 17, No. 5, pp. 452-457 (May 1998).
European Search Report dated Nov. 15, 2004, from European Application No. EP 00 99 1744.
European Communication dated Mar. 17, 2005, from European Application No. EP 00 99 1744.
European Communication dated Feb. 13, 2006, from European Application No. EP 00 99 1744.
European Communication dated Apr. 23, 2007, from European Application No. EP 00 99 1744.
European Communication dated Mar. 14, 2008, from European Application No. EP 00 99 1744.
Supplementary European Search Report dated Nov. 15, 2004, from European Application No. EP 00 98 0401.
European Communication dated Feb. 1, 2005, from European Application No. EP 00 98 0401.
European Communication under Rule 51(4) EPC dated Mar. 17, 2006, from European Application No. EP 00 98 0401.
European Communication, including European Search Report, dated Oct. 26, 2006, from European Application No. EP 06 01 5955.
European Communication dated Jun. 14, 2007, from European Application No. EP 06 01 5955.
European Communication dated Apr. 8, 2008, from European Application No. EP 06 01 5955.
European Communication under Rule 71(3) EPC dated May 25, 2009, from European Application No. EP 06 01 5955.
European Communication pursuant to Article 94(3) EPC dated Jul. 1, 2010, including the European Search Report, from European Patent Application No. 09170518.6, 8pp.
European Communication pursuant to Article 94(3) EPC dated Jun. 6, 2012, from European Patent Application No. 09170518.6, 5 pp.
Fagot et al., "On Calculating Efficient LFSR Seeds for Built-In Self Test," *IEEE*, pp. 7-14 (1999).
Frohwerk, "Signature analysis: a new digital field services method," *Hewlett-Packard Journal*, pp. 2-8 (May 1977).
Ghosh-Dastidar et al., "Fault Diagnosis in Scan-Based BIST Using Both Time and Space Information," *Proc. ITC*, pp. 95-102 (Sep. 1999).
Golomb, *Shift Register Sequences*, Holden Day, San Francisco (1967).
Hamzaoglu et al., "Reducing Test Application Time for Full Scan Embedded Cores," *IEEE Proc. FTCS*, pp. 260-267 (1999).
Hayes, "Check sum test methods," *Proc. FTCS*, pp. 114-120 (1976).

Hayes, "Transition count testing of combinational logic circuits," *IEEE Transactions on Computers*, vol. C-25, No. 6, pp. 613-620 (1976).
Hellebrand et al., "Built-in Test for Circuits With Scan Based on Reseeding of Multiple Polynomial Linear Feedback Shift Registers," *IEEE Trans. On Computers*, vol. C-44, pp. 223-233 (Feb. 1995).
Hellebrand et al., "Generation of Vector Patterns Through Reseeding of Multiple-Polynomial Linear Feedback Shift Registers," *IEEE International Test Conference*, pp. 120-129 (1992).
Hellebrand et al., "Pattern Generation for a Deterministic BIST Scheme," *Proc. I-ICAD*, pp. 88-94 (1995).
Hetherington et al., "Logic BIST for Large Industrial Designs: Real Issues and Case Studies," *Proc. ITC*, pp. 358-367 (1999).
International Preliminary Examination Report from International Application No. PCT/US00/31376.
International Preliminary Examination Report dated Feb. 10, 2003, from International Application No. PCT/US00/42211.
International Search Report from International Application No. PCT/US00/31376.
International Search Report dated May 31, 2001, from International Application No. PCT/US00/42211.
Ireland et al., "Matrix method to determine shift-register connections for delayed pseudorandom binary sequences," *Electronics Letters*, vol. 4 No. 15, pp. 309-310 (1968).
Ishida et al., "COMPACT: A hybrid method for compressing test data," *Proc. VLSI Test Symposium*, pp. 62-69 (1998).
Ivanov et al., "Programmable BIST space compactors," *IEEE Transactions on Computers*, vol. C-45, No. 12, pp. 1393-1404 (1996).
Iyengar et al., "Built-In Self-testing of sequential circuits using precomputed test sets," *Proc. VLSI Test Symposium*, pp. 418-423 (1998).
Japanese Notice of Rejection dated Mar. 24, 2005, including an English-language translation, from Japanese Patent Application No. 2001-540825.
Japanese Official Action dated Jan. 27, 2009, including an English-language translation, from Japanese Patent Application No. 2005-284623.
Japanese Notice of Grounds for Rejection dated Apr. 5, 2005, from Japanese Application No. 2001-540386.
Japanese Notice of Grounds for Rejection dated Aug. 7, 2006, from Japanese Application No. 2001-540386.
Jas et al., "Scan vector compression/decompression using statistical coding," *Proc. VLSI Test Symposium*, pp. 114-120 (1999).
Jas et al., "Test vector decompression via cyclical scan chains and its application to testing core-based designs," *Proc. ITC*, pp. 458-464 (1998).
Jone et al., "Space compression method for built-in self testing of VLSI circuits," *Int. Journal of Computer Aided VLSI Design*, vol. 3, pp. 309-322 (1991).
Kapur et al., "Design of an efficient weighted random pattern generation system," *Proc. ITC.*, pp. 491-500 (1994).
Karpovsky et al., "Board-Level Diagnosis by Signature Analysis," *Proc. ITC*, pp. 47-53 (1988).
Karpovsky et al., "Design of Self-Diagnostic Boards by Multiple Signature Analysis," *IEEE Trans. on Computers*, vol. 42, No. 9, pp. 1035-1044 (Sep. 1993).
Kiln et al., "On using signature registers as pseudorandom pattern generators in built-in self-testing," *IEEE Trans. CAD of IC*, vol. CAD-7, No. 8, 1988, pp. 919-928.
Koenemann, c/o IBM Corp., B56/901, "LFSR-Coded Test Patterns for Scan Designs," *Proc. European Test Conference*, pp. 237-242 (1991).
Konemann et al., "Built-In Logic Block Observation Techniques," *IEEE Test Conference*, 6 pp. (1979).
Kundu, "On Diagnosis of Faults in a Scan-Chain," *Proc. VLSI Test Symp.*, pp. 303-308 (1993).
Langdon, Jr., "An Introduction to Arithmetic Coding," *IBM J. Res. Develop.*, vol. 28, No. 2, pp. 135-149 (Mar. 1984).
Latawiec, "New method of generation of shifted linear pseudorandom binary sequences," *Proc. IEE*, vol. 121, No. 8, pp. 905-906 (1974).

(56) References Cited

OTHER PUBLICATIONS

Lew Yan Voon et al., "BIST Linear Generator based on Complemented Outputs," *IEEE VLSI Test Symp.*, pp. 137-142 (1992).

Li et al., "Space compression methods with output data modification," *IEEE Trans. CAD if Integrated Circuits and Systems*, vol. CAD-6, No. 2, pp. 290-294 (1987).

Mano, "Decoders and Multiplexers," in *Computer System Architecture*, Chapter 2, pp. 50-54 (1982).

Mrugalski et al., "Synthesis of pattern generators based on cellular automata with phase shifters," *Proc. ITC*, pp. 368-377 (1999).

Muradali et al., "A new procedure for weighted random built-in self-test," *Proc. ITC.*, pp. 600-669 (1990).

Narayanan et al., "An Efficient Scheme to Diagnose Scan Chains," *Proc. ITC*, pp. 704-713 (1997).

Pateras et al., "Cube-contained random patterns and their application to the complete testing of synthesized multi-level circuits," *Proc. ITC.*, pp. 473-482 (1991).

Pouya et al., "Synthesis of zero-aliasing elementary-tree space compactors," *Proc. VLSI Test Symp.*, pp. 70-77 (1998).

Rajski et al., "Accumulator-based compaction of test responses," *IEEE Trans. on Computers*, vol. C-42, No. 6, pp. 643-650 (1993).

Rajski et al., Chapter 3, "Test Response Compaction," and Chapter 4, "Fault Diagnosis," in *Arithmetic Built-In Self-Test for Embedded Systems*, pp. 87-133 (1998).

Rajski et al., "Automated Synthesis of Large Phase Shifters for Built-In Self-Test," *Proc. ITC*, Paper 41.1, pp. 1047-1056, (1998).

Rajski et al., "Decompression of Test Data Using Variable-Length Seed LFSRs," *Proc. VLSI Test Symp.*, pp. 426-433, (1995).

Rajski et al., "Design of Phase Shifters for BIST Applications," *Proc. VLSI Test Symp.*, pp. 218-224 (1998).

Rajski et al., "Diagnosis of Scan Cells in BIST Environment," *IEEE Trans. on Computers*, vol. 48, No. 7, pp. 724-731 (Jul. 1999).

Rajski et al., "Test Data Decompression for Multiple Scan Designs with Boundary Scan," *IEEE Trans. on Computers*, vol. 47, No. 11, pp. 1188-1200 (Nov. 1998).

Rajski et al., "Test responses compaction in accumulators with rotate carry adders," *IEEE Trans. CAD of Integrated Circuits and Systems*, vol. CAD-12, No. 4, pp. 531-539 (1993).

Reddy et al., "A Data compression technique for built-in self-test," *IEEE Trans. on Computers*, vol. C-37, pp. 1151-1156 (1988).

Saluja et al., "Testing Computer Hardware through Data Compression in Space and Time," *Proc. ITC*, pp. 83-88 (1983).

Savir, "Syndrome-testable design of combinational circuits," *IEEE Trans. on Computers*, vol. C-29, No. 6, pp. 442-451 (1980).

Saxena et al., "Accumulator compression testing," IEEE Trans. on Computers, vol. C-35, No. 4, pp. 317-321 (1986).

Saxena et al., "Analysis of checksums, extended-precision checksums, and cyclic redundancy," *IEEE Trans. on Computers*, vol. C-39, No. 7, pp. 969-975, 1990.

Saxena et al., "Extended precision checksums," *Proc. FTCS*, pp. 142-147 (1987).

Serra et al., "The analysis of one-dimensional linear cellular automata and their aliasing properties," *IEEE Trans. CAD of Integrated Circuits and Systems*, vol. CAD-9, No. 7, pp. 767-778 (1990).

Smith, "Measures of the effectiveness of fault signature analysis," *IEEE Trans. on Computers*, vol. C-29, No. 6, pp. 510-514 (1980).

Touba et al., "Altering a pseudo-random bit sequence for scan-based BIST," *Proc. ITC*, pp. 167-175 (1996).

Touba et al., "Transformed pseudo-random patterns for BIST," *Proc. VLSI Test Symp.*, pp. 410-416 (1995).

Tsai et al., "STARBIST: Scan autocorrelated random pattern generation," *Proc. DAC*, pp. 472-477 (1997).

Venkataraman et al., "An Efficient BIST Scheme Based on Reseeding of Multiple Polynomial Linear Feedback Shift Registers," *IEEE*, pp. 572-577 (1993).

Waicukauski et al., "A method for generating weighted random test patterns," *IBM J. Res. Develop.*, vol. 33, No. 2, pp. 149-161 (Mar. 1989).

Wang, "BIST Using Pseudorandom Test Vectors and Signature Analysis," *IEEE Custom Integrated Circuits Conference*, pp. 1611-1618 (1998).

Williams et al., "Bounds and analysis of aliasing errors in linear-feedback shift registers," *IEEE Trans. CAD of Integrated Circuits and Systems*, vol. CAD-7, No. 1, pp. 75-83 (1988).

Written Opinion from International Application No. PCT/US00/31376.

Written Opinion dated Jun. 26, 2002, from International Application No. PCT/US00/42211.

Wu et al., "Scan-Based BIST Fault Diagnosis," *IEEE Trans. CAD of Integrated Circuits and Systems*, vol. 18, No. 2, pp. 203-211 (Feb. 1999).

Wunderlich et al., "Bit-flipping BIST," *Proc. ICCAD*, pp. 337-343 (1996).

Wunderlich, "Multiple distribution for biased random test patterns," *Proc. ITC*, pp. 236-244 (1988).

Wunderlich, "On computing optimized input probabilities for random tests," *Proc. DAC*, pp. 392-398 (1987).

Yamaguchi et al., "An efficient method for compressing test data," *Proc. ITC*, pp. 191-199 (1997).

Yarmolik et al., "Generation and Application of Pseudorandom Sequences for Random Testing," J. Wiley & Sons, New York (1988).

Zacharia et al., "Decompression of Test Data Using Variable Length Seed LFSRs," *IEEE*, pp. 426-433 (1995).

Zacharia et al., "Two-Dimensional Test Data Decompressor for Multiple Scan Designs," *Proc. ITC*, pp. 186-194 (1996).

Zorian et al., "Programmable Space Compaction for BIST," *IEEE*, pp. 340-349 (Jun. 1993).

Scan chain 0
$a_2 \oplus a_4 \oplus a_5$
$a_4 \oplus a_6 \oplus a_7$
$a_1 \oplus a_6 \oplus a_8 \oplus a_9$
$a_1 \oplus a_3 \oplus a_8 \oplus a_{10} \oplus a_{11}$
$a_3 \oplus a_5 \oplus a_{10} \oplus a_{12} \oplus a_{13}$
$a_0 \oplus a_1 \oplus a_4 \oplus a_5 \oplus a_8 \oplus a_9 \oplus a_{11} \oplus a_{12} \oplus a_{13} \oplus a_{16}$
$a_0 \oplus a_2 \oplus a_7 \oplus a_9 \oplus a_{14} \oplus a_{16} \oplus a_{17}$
$a_0 \oplus a_2 \oplus a_4 \oplus a_9 \oplus a_{11} \oplus a_{16} \oplus a_{18} \oplus a_{19}$ Scan chain 1
$a_1 \oplus a_2 \oplus a_3 \oplus a_6$
$a_0 \oplus a_1 \oplus a_3 \oplus a_4 \oplus a_5 \oplus a_8$
$a_2 \oplus a_3 \oplus a_5 \oplus a_6 \oplus a_7 \oplus a_{10}$
$a_0 \oplus a_1 \oplus a_4 \oplus a_5 \oplus a_7 \oplus a_8 \oplus a_9 \oplus a_{12}$
$a_2 \oplus a_3 \oplus a_6 \oplus a_7 \oplus a_9 \oplus a_{10} \oplus a_{11} \oplus a_{14}$
$a_0 \oplus a_5 \oplus a_7 \oplus a_{12} \oplus a_{14} \oplus a_{15}$
$a_0 \oplus a_2 \oplus a_3 \oplus a_6 \oplus a_7 \oplus a_{10} \oplus a_{11} \oplus a_{13} \oplus a_{14} \oplus a_{15} \oplus a_{18}$
$a_0 \oplus a_1 \oplus a_2 \oplus a_4 \oplus a_5 \oplus a_8 \oplus a_9 \oplus a_{12} \oplus a_{13} \oplus a_{15} \oplus a_{16} \oplus a_{17} \oplus a_{20}$ Scan chain 2
$a_3$
$a_0 \oplus a_5$
$a_2 \oplus a_7$
$a_0 \oplus a_4 \oplus a_5$
$a_2 \oplus a_6 \oplus a_{11}$
$a_0 \oplus a_1 \oplus a_4 \oplus a_8 \oplus a_{13}$
$a_0 \oplus a_2 \oplus a_3 \oplus a_6 \oplus a_{10} \oplus a_{15}$
$a_1 \oplus a_2 \oplus a_4 \oplus a_5 \oplus a_8 \oplus a_{12} \oplus a_{17}$ Scan chain 3
$a_0 \oplus a_1 \oplus a_5 \oplus a_7$
$a_2 \oplus a_3 \oplus a_7 \oplus a_9$
$a_4 \oplus a_5 \oplus a_9 \oplus a_{11}$
$a_6 \oplus a_7 \oplus a_{11} \oplus a_{13}$
$a_1 \oplus a_8 \oplus a_9 \oplus a_{13} \oplus a_{15}$
$a_0 \oplus a_3 \oplus a_{10} \oplus a_{11} \oplus a_{15} \oplus a_{17}$
$a_0 \oplus a_2 \oplus a_5 \oplus a_{12} \oplus a_{13} \oplus a_{17} \oplus a_{19}$
$a_2 \oplus a_4 \oplus a_7 \oplus a_{14} \oplus a_{15} \oplus a_{19} \oplus a_{21}$ Scan chain 4
$a_0 \oplus a_4 \oplus a_7$
$a_0 \oplus a_2 \oplus a_6 \oplus a_9$
$a_0 \oplus a_1 \oplus a_2 \oplus a_4 \oplus a_8 \oplus a_{11}$
$a_0 \oplus a_2 \oplus a_3 \oplus a_4 \oplus a_6 \oplus a_{10} \oplus a_{13}$
$a_1 \oplus a_2 \oplus a_4 \oplus a_5 \oplus a_6 \oplus a_8 \oplus a_{12} \oplus a_{15}$
$a_1 \oplus a_3 \oplus a_4 \oplus a_6 \oplus a_7 \oplus a_8 \oplus a_{10} \oplus a_{14} \oplus a_{17}$
$a_1 \oplus a_3 \oplus a_5 \oplus a_6 \oplus a_8 \oplus a_9 \oplus a_{10} \oplus a_{12} \oplus a_{16} \oplus a_{19}$
$a_0 \oplus a_1 \oplus a_3 \oplus a_5 \oplus a_7 \oplus a_8 \oplus a_{10} \oplus a_{11} \oplus a_{12} \oplus a_{13} \oplus a_{18} \oplus a_{21}$ Scan chain 5
$a_0 \oplus a_5 \oplus a_6$
$a_0 \oplus a_1 \oplus a_2 \oplus a_7 \oplus a_8$
$a_2 \oplus a_3 \oplus a_4 \oplus a_9 \oplus a_{10}$
$a_0 \oplus a_4 \oplus a_5 \oplus a_6 \oplus a_{11} \oplus a_{12}$
$a_0 \oplus a_1 \oplus a_2 \oplus a_6 \oplus a_7 \oplus a_8 \oplus a_{13} \oplus a_{14}$
$a_0 \oplus a_1 \oplus a_2 \oplus a_3 \oplus a_4 \oplus a_8 \oplus a_9 \oplus a_{10} \oplus a_{15} \oplus a_{16}$
$a_2 \oplus a_3 \oplus a_4 \oplus a_5 \oplus a_6 \oplus a_{10} \oplus a_{11} \oplus a_{12} \oplus a_{17} \oplus a_{18}$
$a_1 \oplus a_4 \oplus a_5 \oplus a_6 \oplus a_7 \oplus a_8 \oplus a_{12} \oplus a_{13} \oplus a_{14} \oplus a_{19} \oplus a_{20}$ Scan chain 6
$a_0 \oplus a_1 \oplus a_2 \oplus a_6$
$a_1 \oplus a_2 \oplus a_3 \oplus a_4 \oplus a_8$
$a_3 \oplus a_4 \oplus a_5 \oplus a_6 \oplus a_{10}$
$a_1 \oplus a_5 \oplus a_6 \oplus a_7 \oplus a_8 \oplus a_9$
$a_0 \oplus a_1 \oplus a_3 \oplus a_7 \oplus a_8 \oplus a_9 \oplus a_{10} \oplus a_{11}$
$a_0 \oplus a_2 \oplus a_3 \oplus a_5 \oplus a_9 \oplus a_{10} \oplus a_{11} \oplus a_{12} \oplus a_{16}$
$a_0 \oplus a_2 \oplus a_4 \oplus a_5 \oplus a_7 \oplus a_{11} \oplus a_{12} \oplus a_{13} \oplus a_{14} \oplus a_{18}$
$a_0 \oplus a_2 \oplus a_4 \oplus a_6 \oplus a_7 \oplus a_9 \oplus a_{13} \oplus a_{14} \oplus a_{15} \oplus a_{16} \oplus a_{20}$ Scan chain 7
$a_2 \oplus a_3 \oplus a_5$
$a_0 \oplus a_4 \oplus a_5 \oplus a_7$
$a_0 \oplus a_2 \oplus a_6 \oplus a_7 \oplus a_9$
$a_1 \oplus a_2 \oplus a_4 \oplus a_8 \oplus a_9 \oplus a_{11}$
$a_0 \oplus a_3 \oplus a_4 \oplus a_6 \oplus a_{10} \oplus a_{11} \oplus a_{13}$
$a_1 \oplus a_2 \oplus a_5 \oplus a_6 \oplus a_8 \oplus a_{12} \oplus a_{13} \oplus a_{15}$
$a_1 \oplus a_3 \oplus a_4 \oplus a_7 \oplus a_8 \oplus a_{10} \oplus a_{14} \oplus a_{15} \oplus a_{17}$
$a_0 \oplus a_3 \oplus a_5 \oplus a_6 \oplus a_9 \oplus a_{10} \oplus a_{12} \oplus a_{16} \oplus a_{17} \oplus a_{19}$

FIG. 7

CONTINUOUS APPLICATION AND DECOMPRESSION OF TEST PATTERNS AND SELECTIVE COMPACTION OF TEST RESPONSES

RELATED APPLICATION DATA

This application is a continuation of U.S. patent application Ser. No. 14/021,800, filed on Sep. 9, 2013, which is a divisional of U.S. patent application Ser. No. 13/013,712, filed on Jan. 25, 2011, now U.S. Pat. No. 8,533,547, which is a continuation-in-part of U.S. patent application Ser. No. 12/891,498, filed on Sep. 27, 2010, now U.S. Pat. No. 8,108,743, which is a continuation of U.S. patent application Ser. No. 12/396,377, filed Mar. 2, 2009, now U.S. Pat. No. 7,805,649, which is a continuation of U.S. patent application Ser. No. 10/973,522, filed Oct. 25, 2004, now U.S. Pat. No. 7,500,163, which is a continuation of U.S. patent application Ser. No. 10/354,576, filed Jan. 29, 2003, now U.S. Pat. No. 6,829,740, which is a continuation of U.S. patent application Ser. No. 09/619,988, filed Jul. 20, 2000, now U.S. Pat. No. 6,557,129, which claims the benefit of U.S. Provisional Application No. 60/167,136, filed Nov. 23, 1999, all of which are hereby incorporated herein by reference.

This application is also a continuation of U.S. patent application Ser. No. 14/021,800, filed on Sep. 9, 2013, which is a divisional of U.S. patent application Ser. No. 13/013,712, filed on Jan. 25, 2011, now U.S. Pat. No. 8,533,547, which is a continuation-in-part of U.S. patent application Ser. No. 12/352,994, filed Jan. 13, 2009, now U.S. Pat. No. 7,877,656, which is a continuation of U.S. patent application Ser. No. 10/354,633, filed Jan. 29, 2003, now U.S. Pat. No. 7,478,296, which is a continuation of U.S. patent application Ser. No. 09/620,021, filed Jul. 20, 2000, now U.S. Pat. No. 7,493,540, which claims the benefit of U.S. Provisional Application No. 60/167,131, filed Nov. 23, 1999, all of which are hereby incorporated herein by reference.

This application is also a continuation of U.S. patent application Ser. No. 14/021,800, filed on Sep. 9, 2013, which is a divisional of U.S. patent application Ser. No. 13/013,712, filed on Jan. 25, 2011, now U.S. Pat. No. 8,533,547, which is a continuation-in-part of U.S. patent application Ser. No. 12/983,815, filed on Jan. 3, 2011, which is a continuation of U.S. patent application Ser. No. 12/402,880, filed Mar. 12, 2009, now U.S. Pat. No. 7,865,794, which is a continuation of U.S. patent application Ser. No. 11/502,655, filed Aug. 11, 2006, now U.S. Pat. No. 7,506,232, which is a continuation of U.S. patent application Ser. No. 10/736,966, filed Dec. 15, 2003, now U.S. Pat. No. 7,093,175, which is a continuation of U.S. patent application Ser. No. 09/713,664, filed Nov. 15, 2000, now U.S. Pat. No. 6,684,358, which claims the benefit of U.S. Provisional Application No. 60/167,137, filed Nov. 23, 1999, all of which are hereby incorporated herein by reference.

This application is also a continuation of U.S. patent application Ser. No. 14/021,800, filed on Sep. 9, 2013, which is a divisional of U.S. patent application Ser. No. 13/013,712, filed on Jan. 25, 2011, now U.S. Pat. No. 8,533,547, which is a continuation-in-part of U.S. patent application Ser. No. 11/894,393, filed on Aug. 20, 2007, now U.S. Pat. No. 8,024,387, which is a continuation of U.S. patent application Ser. No. 10/781,031, filed Feb. 17, 2004, now U.S. Pat. No. 7,260,591, which is a continuation U.S. patent application Ser. No. 10/346,699, filed Jan. 16, 2003, now U.S. Pat. No. 6,708,192, which is a continuation of U.S. patent application Ser. No. 09/957,701, filed Sep. 18, 2001, now U.S. Pat. No. 6,539,409, which is a continuation of U.S. patent application Ser. No. 09/620,023, filed Jul. 20, 2000, now U.S. Pat. No. 6,353,842, which claims the benefit of U.S. Provisional Application No. 60/167,445, filed Nov. 23, 1999, all of which are hereby incorporated herein by reference.

This application is also a continuation of U.S. patent application Ser. No. 14/021,800, filed on Sep. 9, 2013, which is a divisional of U.S. patent application Ser. No. 13/013,712, filed on Jan. 25, 2011, now U.S. Pat. No. 8,533,547, which is a continuation-in-part of U.S. patent application Ser. No. 12/405,409, filed on Mar. 17, 2009, now U.S. Pat. No. 7,900,104, which is a continuation of Ser. No. 11/523,111 filed Sep. 18, 2006, now U.S. Pat. No. 7,509,546, which is a continuation of U.S. patent application Ser. No. 10/355,941 filed Jan. 31, 2003, now U.S. Pat. No. 7,111,209, which is a continuation of U.S. patent application Ser. No. 09/947,160 filed Sep. 4, 2001, now U.S. Pat. No. 6,543,020, which is a continuation of U.S. patent application Ser. No. 09/619,985 filed Jul. 20, 2000, now U.S. Pat. No. 6,327,687, which claims the benefit of U.S. Provisional Application No. 60/167,446 filed Nov. 23, 1999, all of which are hereby incorporated herein by reference.

TECHNICAL FIELD

This invention relates generally to testing of integrated circuits and, more particularly, to the generation and application of test data in the form of patterns, or vectors, to scan chains within a circuit-under-test. This invention also relates generally to testing of integrated circuits and more particularly relates to compaction of test responses used in testing for faults in integrated circuits.

BACKGROUND

As integrated circuits are produced with greater and greater levels of circuit density, efficient testing schemes that guarantee very high fault coverage while minimizing test costs and chip area overhead have become essential. However, as the complexity of circuits continues to increase, high fault coverage of several types of fault models becomes more difficult to achieve with traditional testing paradigms. This difficulty arises for several reasons. First, larger integrated circuits have a very high and still increasing logic-to-pin ratio that creates a test data transfer bottleneck at the chip pins. Second, larger circuits require a prohibitively large volume of test data that must be then stored in external testing equipment. Third, applying the test data to a large circuit requires an increasingly long test application time. And fourth, present external testing equipment is unable to test such larger circuits at their speed of operation.

Integrated circuits are presently tested using a number of structured design for testability (DFT) techniques. These techniques rest on the general concept of making all or some state variables (memory elements like flip-flops and latches) directly controllable and observable. If this can be arranged, a circuit can be treated, as far as testing of combinational faults is concerned, as a combinational network. The most-often used DFT methodology is based on scan chains. It assumes that during testing, all (or almost all) memory elements are connected into one or more shift registers, as shown in the U.S. Pat. No. 4,503,537. A circuit that has been designed for test has two modes of operation: a normal mode and a test, or scan, mode. In the normal mode, the memory elements perform their regular functions. In the scan mode, the memory elements become scan cells that are connected to form a number of shift registers called scan chains. These scan chains are used to shift a set of test patterns into the circuit and to shift out circuit, or test, responses to the test patterns. The test responses are then compared to fault-free responses to determine if the circuit-under-test (CUT) works properly.

Scan design methodology has gained widespread adoption by virtue of its simple automatic test pattern generation (ATPG) and silicon debugging capabilities. Today, ATPG software tools are so efficient that it is possible to generate test sets (a collection of test patterns) that guarantee almost complete fault coverage of several types of fault models including stuck-at, transition, path delay faults, and bridging faults. Typically, when a particular potential fault in a circuit is targeted by an ATPG tool, only a small number of scan cells, e.g., 2-5%, must be specified to detect the particular fault (deterministically specified cells). The remaining scan cells in the scan chains are filled with random binary values (randomly specified cells). This way the pattern is fully specified, more likely to detect some additional faults, and can be stored on a tester.

Because of the random fill requirement, however, the test patterns are grossly over-specified. These large test patterns require extensive tester memory to store and a considerable time to apply from the tester to a circuit-under-test. FIG. 1 is a block diagram of a conventional system 18 for testing digital circuits with scan chains. External automatic testing equipment (ATE), or tester, 20 applies a set of fully specified test patterns 22 one by one to a CUT 24 in scan mode via scan chains 26 within the circuit. The circuit is then run in normal mode using the test pattern as input, and the test response to the test pattern is stored in the scan chains. With the circuit again in scan mode, the response is then routed to the tester 20, which compares the response with a fault-free reference response 28, also one by one. For large circuits, this approach becomes infeasible because of large test set sizes and long test application times. It has been reported that the volume of test data can exceed one kilobit per single logic gate in a large design. The significant limitation of this approach is that it requires an expensive, memory-intensive tester and a long test time to test a complex circuit.

These limitations of time and storage can be overcome to some extent by adopting a built-in self-test (BIST) framework, as shown in the U.S. Pat. No. 4,503,537 and FIG. 13. In BIST, additional on-chip circuitry is included to generate test patterns, evaluate test responses, and control the test. For example, a pseudo-random pattern generator 121 is used to generate the test patterns, instead of having deterministic test patterns. Additionally, a multiple input signature register (MISR) 122 is used to generate and store a resulting signature from test responses. In conventional logic BIST, where pseudo-random patterns are used as test patterns, 95-96% coverage of stuck-at faults can be achieved provided that test points are employed to address random-pattern resistant faults. On average, one to two test points may be required for every 1000 gates. In BIST, all responses propagating to observable outputs and the signature register have to be known. Unknown values corrupt the signature and therefore must be bounded by additional test logic. Even though pseudo-random test patterns appear to cover a significant percentage of stuck-at faults, these patterns must be supplemented by deterministic patterns that target the remaining, random pattern resistant faults. Very often the tester memory required to store the supplemental patterns in BIST exceeds 50% of the memory required in the deterministic approach described above. Another limitation of BIST is that other types of faults, such as transition or path delay faults, are not handled efficiently by pseudo-random patterns. Because of the complexity of the circuits and the limitations inherent in BIST, it is extremely difficult, if not impossible, to provide a set of specified test patterns that fully covers hard-to-test faults.

Weighted pseudo-random testing is another method that is used to address the issue of the random pattern resistant faults. In principle, this approach expands the pseudo-random test pattern generators by biasing the probabilities of the input bits so that the tests needed for hard-to-test faults are more likely to occur. In general, however, a circuit may require a very large number of sets of weights, and, for each weight set, a number of random patterns have to be applied. Thus, although the volume of test data is usually reduced in comparison to fully specified deterministic test patterns, the resultant test application time increases. Moreover, weighted pseudo-random testing still leaves a fraction of the fault list left uncovered. Details of weighted random pattern test systems and related methods can be found in a number of references including U.S. Pat. Nos. 4,687,988; 4,801,870; 5,394,405; 5,414,716; and 5,612,963. Weighted random patterns have been primarily used as a solution to compress the test data on the tester. The generation hardware appears to be too complex to place it on the chip. Consequently, the voluminous test data is produced off-chip and must pass through relatively slow tester channels to the circuit-under-test. Effectively, the test application time can be much longer than that consumed by the conventional deterministic approach using ATPG patterns.

Several methods to compress test data before transmitting it to the circuit-under-test have been suggested. They are based on the observation that the test cubes (i.e., the arrangement of test patterns bits as they are stored within the scan chains of a circuit-under-test) frequently feature a large number of unspecified (don't care) positions. One method, known as reseeding of linear feedback shift registers (LFSRs), was first proposed in B. Koenemann, "LFSR-Coded Test Patterns For Scan Designs," *Proc. European Test Conference*, pp. 237-242 (1991). Consider an n-bit LFSR with a fixed polynomial. Its output sequence is then completely determined by the initial seed. Thus, applying the feedback equations recursively provides a system of linear equations depending only on the seed variables. These equations can be associated with the successive positions of the LFSR output sequence. Consequently, a seed corresponding to the actual test pattern can be determined by solving the system of linear equations, where each equation represents one of the specified positions in the test pattern. Loading the resultant seed into the LFSR and subsequently clocking it will produce the desired test pattern. A disadvantage of this approach, however, is that seed, which encodes the contents of the test cube, is limited to approximately the size of the LFSR. If the test cube has more specified positions than the number of stages in LFSR, the test cube cannot be easily encoded with a seed. Another disadvantage of this approach is the time it requires. A tester cannot fill the LFSR with a seed concurrently with the LFSR generating a test pattern from the seed. Each of these acts must be done at mutually exclusive times. This makes the operation of the tester very inefficient, i.e., when the seed is serially loaded to the LFSR the scan chains do not operate; and when the loading of the scan chains takes place, the tester cannot transfer a seed to the LFSR.

Another compression method is based on reseeding of multiple polynomial LFSRs (MP-LFSRs) as proposed in S. Hellebrand et al., "Built-In Test For Circuits With Scan Based On Reseeding of Multiple Polynomial Linear Feedback Shift Registers," *IEEE Trans. On Computers*, vol.

C-44, pp. 223-233 (1995). In this method, a concatenated group of test cubes is encoded with a number of bits specifying a seed and a polynomial identifier. The content of the MP-LFSR is loaded for each test group and has to be preserved during the decompression of each test cube within the group. The implementation of the decompressor involves adding extra memory elements to avoid overwriting the content of the MP-LFSR during the decompression of a group of test patterns. A similar technique has been also discussed in S. Hellebrand et al., "Pattern generation for a deterministic BIST scheme," *Proc. ICCAD*, pp. 88-94 (1995). Reseeding of MP-LFSRs was further enhanced by adopting the concept of variable-length seeds as described in J. Rajski et al., "Decompression of test data using variable-length seed LFSRs", *Proc. VLSI Test Symposium*, pp. 426-433 (1995) and in J. Rajski et al., "Test Data Decompression for Multiple Scan Designs with Boundary Scan", *IEEE Trans. on Computers*, vol. C-47, pp. 1188-1200 (1998). This technique has a potential for significant improvement of test pattern encoding efficiency, even for test cubes with highly varying number of specified positions. The same documents propose decompression techniques for circuits with multiple scan chains and mechanisms to load seeds into the decompressor structure through the boundary-scan. Although this scheme significantly improves encoding capability, it still suffers from the two drawbacks noted above: seed-length limitations and mutually exclusive times for loading the seed and generating test patterns therefrom.

The above reseeding methods thus suffer from the following limitations. First, the encoding capability of reseeding is limited by the length of the LFSR. In general, it is very difficult to encode a test cube that has more specified positions than the length of the LFSR. Second, the loading of the seed and test pattern generation therefrom are done in two separate, non-overlapping phases. This results in poor utilization of the tester time.

A different attempt to reduce test application time and test data volume is described in I. Hamzaoglu et al., "Reducing Test Application Time For Full Scan Embedded Cores," *Proc. FTCS*-29, pp. 260-267 (1999). This so-called parallel-serial full scan scheme divides the scan chain into multiple partitions and shifts in the same test pattern to each scan chain through a single scan input. Clearly, a given test pattern must not contain contradictory values on corresponding cells in different chains loaded through the same input. Although partially specified test cubes may allow such operations, the performance of this scheme strongly relies on the scan chain configuration, i.e., the number of the scan chains used and the assignment of the memory elements to the scan chains. In large circuits such a mapping is unlikely to assume any desired form, and thus the solution is not easily scalable. Furthermore, a tester using this scheme must be able to handle test patterns of different scan chain lengths, a feature not common to many testers.

Further, some of the DFT techniques include compactors to compress the test responses from the scan chains. There are generally two types of compactors: time compactors and spatial compactors. Time compactors typically have a feedback structure with memory elements for storing a signature, which represents the results of the test. After the signature is completed it is read and compared to a fault-free signature to determine if an error exists in the integrated circuit. Spatial compactors generally compress a collection of bits (called a vector) from scan chains. The compacted output is analyzed in real time as the test responses are shifted out of the scan chains. Spatial compactors can be customized for a given circuit under test to reduce the aliasing phenomenon, as shown in the U.S. Pat. No. 5,790,562 and in few other works based on multiplexed parity trees or nonlinear trees comprising elementary gates such as AND, OR, NAND, and NOR gates.

Linear spatial compactors are built of Exclusive-OR (XOR) or Exclusive-NOR (XNOR) gates to generate n test outputs from the m primary outputs of the circuit under test, where n<m. Linear compactors differ from nonlinear compactors in that the output value of a linear compactor changes with a change in just one input to the compactor. With nonlinear compactors, a change in an input value may go undetected at the output of the compactor. However, even linear compactors may mask errors in an integrated circuit. For example, the basic characteristic an XOR (parity) tree is that any combination of odd number of errors on its inputs propagates to their outputs, and any combination of even number of errors remains undetected.

An ideal compaction algorithm has the following features: (1) it is easy to implement as a part of the on-chip test circuitry, (2) it is not a limiting factor with respect to test time, (3) it provides a logarithmic compression of the test data, and (4) it does not lose information concerning faults. In general, however, there is no known compaction algorithm that satisfies all the above criteria. In particular, it is difficult to ensure that the compressed output obtained from a faulty circuit is not the same as that of the fault-free circuit. This phenomenon is often referred to as error masking or aliasing and is measured in terms of the likelihood of its occurrence. An example of error masking occurs when the spatial compactor reads two fault effects at the same time. The multiple fault effects cancel each other out and the compactor output is the same as if no faults occurred.

Unknown states are also problematic for error detection. An unknown state on one or more inputs of an XOR tree generates unknown values on its output, and consequently masks propagation of faults on other inputs. A common application of space compactors is to combine the observation points inserted into the CUT as a part of design-for-testability methodology. The spatial compactors can be also used to reduce the size of the time compactors by limiting the number of their parallel inputs.

Undoubtedly, the most popular time compactors used in practice are linear feedback shift registers (LFSRs). In its basic form, the LFSR (see FIG. 14) is modified to accept an external input in order to act as a polynomial divider. An alternative implementation (called type II LFSR) is shown in FIG. 15. The input sequence, represented by a polynomial, is divided by the characteristic polynomial of the LFSR. As the division proceeds, the quotient sequence appears at the output of the LFSR and the remainder is kept in the LFSR. Once testing is completed, the content of the LFSR can be treated as a signature.

FIG. 16 shows another time compactor (which is a natural extension of the LFSR-based compactor) called a multiple-input LFSR, also known as a multiple-input signature register (MISR). The MISR is used to test circuits in the multiple scan chain environment such as shown in the U.S. Pat. No. 4,503,537. MISRs feature a number of XOR gates added to the flip-flops. The CUT scan chain outputs are then connected to these gates.

FIG. 17 shows an example of a pipelined spatial compactor with a bank of flip-flops separating stages of XOR gates. A clock (not shown) controls the flip-flops and allows a one-cycle delay before reading the compacted output.

The limitation of spatial compactors, such as the one shown in FIG. 17, is that unknown states can reduce fault coverage. Time compactors, such as shown in FIGS. 14, 15, and 16, are completely unable to handle unknown states since an unknown state on any input can corrupt the compressed output generated by the compactor. With both time compactors and spatial compactors, multiple fault effects can reduce fault coverage. Additionally, if a fault effect is detected within the integrated circuit, these compactors have limited ability to localize the fault.

An object of the invention, therefore, is to provide an efficient compactor that can select which scan chains are analyzed. This ability to select allows the compactor to generate a valid compressed output even when receiving unknown states or multiple fault effects on its inputs. The compactor can also be used diagnostically to determine the location of faults within an integrated circuit.

SUMMARY

A method according to the invention for applying test patterns to scan chains in a circuit-under-test includes providing a compressed test pattern of bits; decompressing the compressed test pattern into a decompressed test pattern of bits as the compressed test pattern is being provided; and applying the decompressed test pattern to scan chains of the circuit-under-test. If desired, the method may further include applying the decompressed test pattern to scan chains of the circuit-under-test as the compressed test pattern is being provided.

The method may also include providing the compressed test pattern, decompressing the compressed test pattern, and applying the decompressed pattern synchronously. These acts may be performed at a same clock rate. Alternatively, the compressed test pattern may be provided at a lower clock rate and the compressed test pattern decompressed and applied at a higher clock rate. In yet another alternative, the compressed pattern may be provided and decompressed at a higher clock rate and the decompressed pattern applied at a lower clock rate.

Decompressing the compressed test pattern may comprise generating during a time period a greater number of decompressed test pattern bits than the number of compressed test pattern bits provided during the same time period. One way the greater number of bits may be generated is by providing a greater number of outputs for decompressed test pattern bits than the number of inputs to which the compressed test pattern bits are provided. Another way the greater number of bits may be generated is by generating the decompressed test pattern bits at a higher clock rate than the clock rate at which the compressed test pattern bits are provided.

Decompressing the compressed test pattern may further comprise generating each bit of the decompressed pattern by logically combining two or more bits of the compressed test pattern. This logically combining may include combining the bits with an XOR operation, an XNOR operation or a combination of the two operations.

In one embodiment of the invention, the providing and decompressing occur within the circuit-under-test. In another embodiment of the invention, the providing and decompressing occur within a tester, the tester applying the decompressed test pattern to scan chains of the circuit-under-test.

A circuit according to the invention may comprise a decompressor, circuit logic, and scan chains for testing the circuit logic. The decompressor is adapted to receive a compressed test pattern of bits and decompress the test pattern into a decompressed test pattern of bits as the compressed test pattern is being received. The scan chains are coupled to the decompressor and are adapted to receive the decompressed test pattern. The decompressor may comprise a linear finite state machine adapted to receive the compressed test pattern.

A tester according to the invention may comprise storage, a decompressor, and one or more tester channels. The storage is adapted to store a set of compressed test patterns of bits. The decompressor is coupled to the storage and adapted to receive a compressed test pattern of bits provided from the storage and to decompress the test pattern into a decompressed test pattern of bits as the compressed test pattern is being received. The tester channels are coupled to the decompressor and adapted to receive a decompressed test pattern and apply the decompressed test pattern to a circuit-under-test.

In another embodiment, a compactor is disclosed that selects test responses in one or more scan chains to compact into a compressed output, while one or more other test responses are masked. Thus, test responses containing unknown states may be masked to ensure that the compactor generates a valid compressed output. Additionally, test responses can be masked to ensure fault masking does not occur. The compactor can also analyze test responses from individual scan chains to diagnostically localize faults in an integrated circuit.

A compactor includes selection circuitry that controls which scan chains are analyzed. The selection circuitry passes desired test responses from scan chains onto a compactor, while masking other test responses. In one embodiment, the selection circuitry may include an identification register that is loaded with a unique identifier of a scan chain. Based on the state of a flag register, either only the test response stored within the scan chain identified is passed to the compactor or all test responses are passed to the compactor except the test response associated with the identified scan chain.

In another embodiment, the selection circuitry includes a flag that controls whether only selected test responses are compacted or whether all test responses are compacted.

In yet another embodiment, a control register is used that individually identifies each scan chain included in compaction. In this embodiment, a variable number (e.g., 1, 2, 3, 4 . . . ) of test responses within scan chains may be included in compaction. Alternatively, the control register may store a unique identifier that is decoded to select one test response that is compacted.

In still another embodiment, the selection circuitry includes a control line that masks bits from scan chains on a per clock-cycle basis. Consequently, a test response may have only individual bits masked while the remaining bits of the test response are compacted.

These and other aspects and features of the invention are described below with reference to the accompanying drawings.

BRIEF DESCRIPTION OF THE DRAWINGS

FIG. 7 shows the logical expressions for the bits stored in each scan cell in the scan chain of FIG. 5

DETAILED DESCRIPTION

Figure 1:
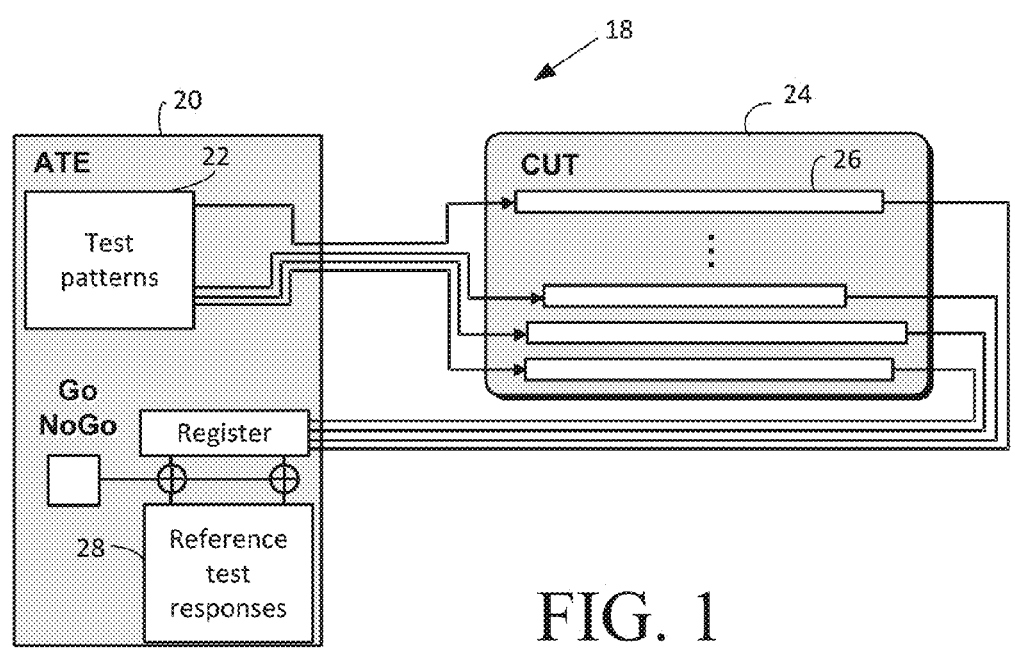
FIG. 1 is a block diagram of a conventional system for testing digital circuits with scan chains.
Figure 2:
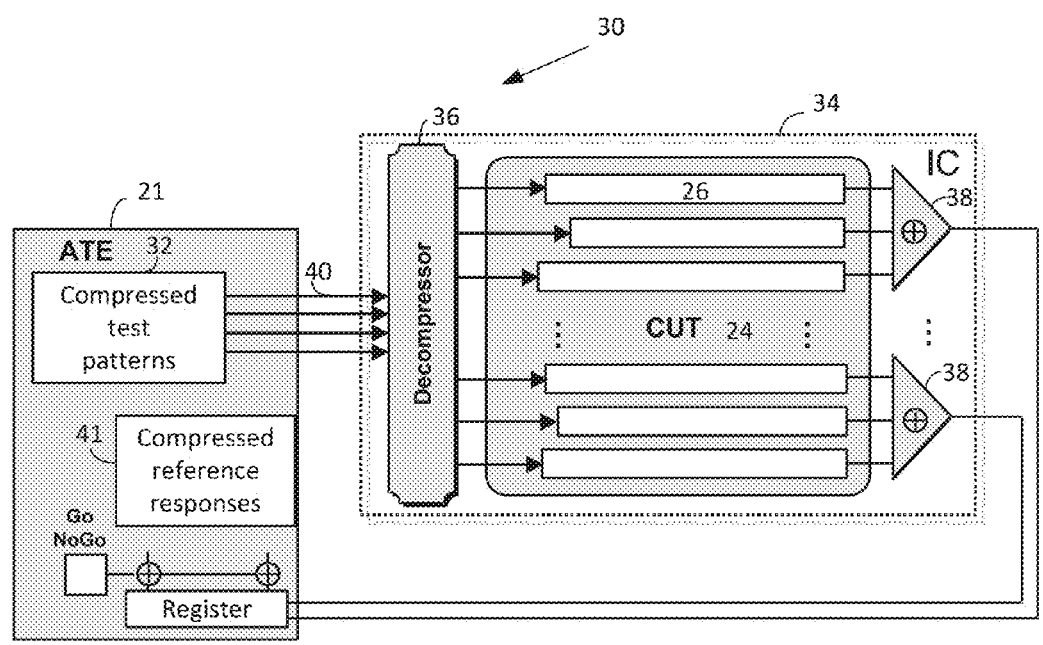
FIG. 2 is a block diagram of a test system according to the invention for testing digital circuits with scan chains.

Continuous Application and Decompression of Test Patterns to a Circuit-Under-Test FIG. 2 is a block diagram of a system 30 according to the invention for testing digital circuits with scan chains. The system includes a tester 21 such as external automatic testing equipment (ATE) and a circuit 34 that includes as all or part of it a circuit-under-test (CUT) 24. The tester 21 provides from storage a set of compressed test patterns 32 of bits, one pattern at a time, through tester channels 40 to the circuit 34 such as an IC. A compressed pattern, as will be described, contains far fewer bits than a conventional uncompressed test pattern. A compressed pattern need contain only enough information to recreate deterministically specified bits. Consequently, a compressed pattern is typically 2% to 5% of the size of a conventional test pattern and requires much less tester memory for storage than conventional patterns. As importantly, compressed test patterns require much less time to transmit from a tester to a CUT 24.

Unlike in the prior reseeding techniques described above, the compressed test patterns 32 are continuously provided from the tester 21 to scan chains 26 within the CUT 24 without interruption. As the compressed test pattern is being provided by the tester 21 to the input channels of a decompressor 36 within the circuit 34, the decompressor decompresses the compressed pattern into a decompressed pattern of bits. The decompressed test pattern is then applied to the scan chains 26. This application is preferably done while the compressed test pattern is being provided to the circuit 34, but it need not be so. After circuit logic within the CUT 24 is clocked with a decompressed test pattern in the scan chains 26, the test response to that pattern is captured in the scan chains and transmitted to the tester 21 for comparison with the compressed fault-free reference responses 41 stored therein.

In a typical configuration, the decompressor 36 has one output per scan chain 26, and there are more scan chains than input channels to the decompressor. However, as will be described, other configurations are also possible in which the decompressor outputs are fewer than or equal to the input channels. The decompressor generates in a given time period a greater number of decompressed bits at its outputs than the number of compressed pattern bits it receives during the same time period. This is the act of decompression, whereby the decompressor 36 generates a greater number of bits than are provided to it in a given time period.

Figure 3:
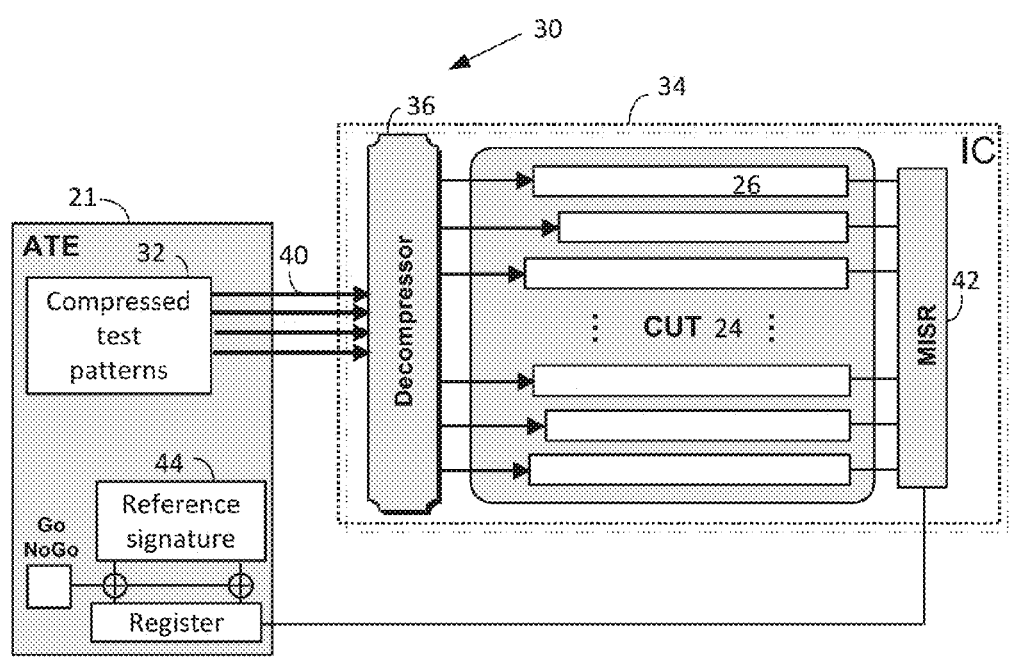
FIG. 3 is a block diagram of a second embodiment of a system according to the invention for testing digital circuits with scan chains.

To reduce the data volume of the test response and the time for sending the response to the tester, the circuit 34 can include means for compressing the test response that is read from the scan chains 26. One structure for providing such compression is one or more spatial compactors 38. The compressed test responses produced by the compactors 38 are then compared one by one with compressed reference responses 40. A fault is detected if a reference response does not match an actual response. FIG. 3 shows another structure that can be used for compressing the test response. A multiple input signature register (MISR) 42 compresses multiple test pattern responses into a signature that is then sent to the tester. There it is compared to a reference signature 44. Compacting the test response in the above ways is desirable but not necessary to the present decompression method and system.

The providing of a compressed test pattern to a circuit, its decompression into a decompressed test pattern, and the application of the decompressed test pattern to the scan chains is performed synchronously, continuously, and substantially concurrently. The rate at which each act occurs, however, can vary. All acts can be performed synchronously at a same clock rate if desired. Or the acts can be performed at different clock rates. If the acts are performed at the same clock rate, or if the compressed test patterns are provided and decompressed at a higher clock rate than at which the decompressed test patterns are applied to the scan chains, then the number of outputs of decompressor 36 and associated scan chains will exceed the number of input channels of the decompressor, as in FIG. 2. In this first case, decompression is achieved by providing more decompressor outputs than input channels. If the compressed test patterns are provided at a lower clock rate and decompressed and applied to the scan chains at a higher clock rate, then the number of outputs and associated scan chains can be the same, fewer, or greater than the number of input channels. In this second case, decompression is achieved by generating the decompressed test pattern bits at a higher clock rate than the clock rate at which the compressed test pattern bits are provided.

Figure 4A:
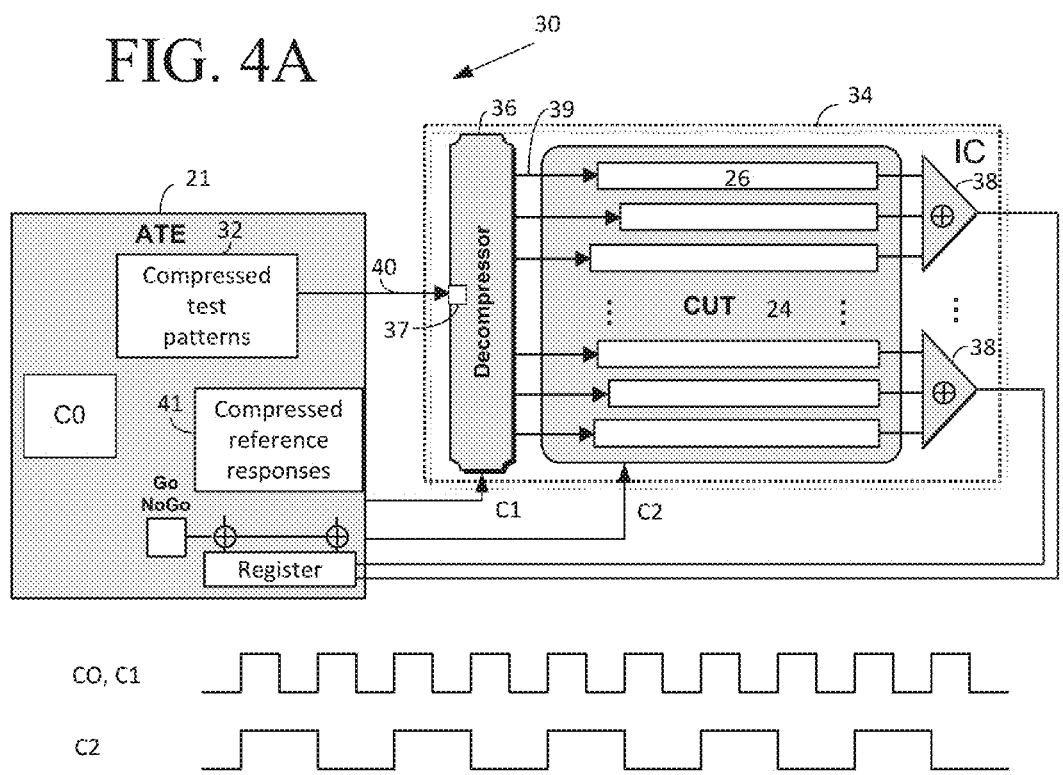
FIGS. 4A-B are block diagrams of a test system according to the invention include timing diagrams illustrating different possible timing relationships possible between the components of the system.

FIG. 4A illustrates an embodiment of the first case in which the compressed pattern is provided and decompressed at a higher clock rate and the decompressed pattern is applied synchronously to the scan chains at a lower clock rate. The tester 21 provides the bits of the compressed pattern through a tester channel 40 to an input channel 37 of the decompressor 36 at a higher rate set by clock 0 (C0). The decompressor is clocked by clock 1 (C1) at the same rate as the tester and produces at outputs 39 the bits of the decompressed pattern at that rate. These decompressed bits, however, are applied to the scan chains 26 at a lower rate set by clock 2 (C2), which clocks the bits into the scan chains. This difference in rates is illustrated in the exemplary timing diagram in FIG. 4A (the actual difference can be much greater). Because of the difference therein, only every other output of the decompressor is written to the scan chains. But that is taken into account in the initial test pattern generation. One advantage of clocking the tester, decompressor, and scan chains as shown is that the tester requires fewer channels than the number of scan chains to provide the test pattern to the CUT 24. By clocking the tester at a higher clock rate C0, the time required to apply the compressed test pattern to the circuit 34 is significantly reduced. Another advantage is in low power applications, where the power dissipated during test mode has to be controlled. This can be done by reducing the clock rate C2 at which bits are shifted into the scan chains.

Figure 4B:
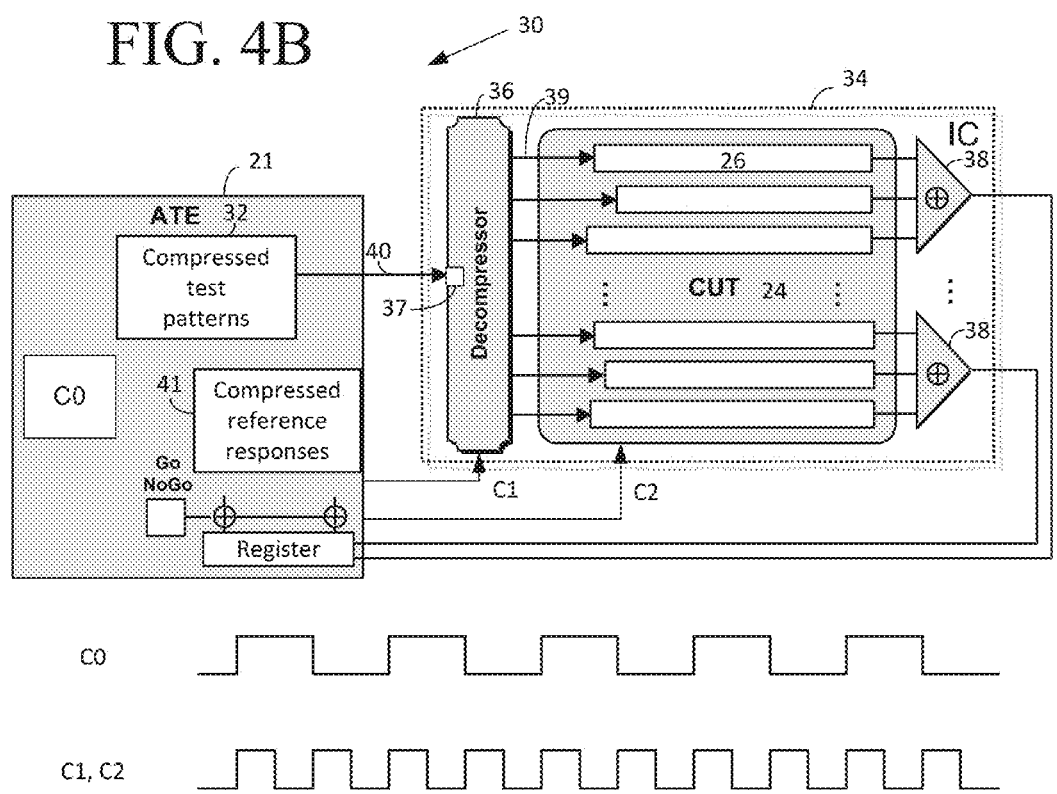

FIG. 4B illustrates an embodiment of the second case in which the compressed test pattern is provided at a lower clock rate and decompressed and applied synchronously at a higher clock rate. Here, the tester 21 provides the bits of the compressed pattern through channels 40 to the input channels 37 of the decompressor 36 at a lower rate set by clock 0 (C0). The decompressor is clocked by clock 1 (C1) at a higher rate. The decompressed bits are applied through its outputs 39 to the scan chains 26 by clock 2 (C2) at the same rate as clock 1. This difference in rates is illustrated in the exemplary timing diagram in FIG. 4B (the actual difference can be much greater). Because of the difference, the decompressor 36 reads the same bits from the tester 21 twice before they change. The decompressor, however, includes a state machine, as will be described, and its outputs change each clock cycle because its internal states change. One advantage of clocking the tester, decompressor, and scan chains as shown in FIG. 4B is that one can utilize a tester 21 that has many channels but with little memory behind them. By providing bits on more tester channels per clock cycle, the lack of memory depth is overcome and the time required for applying the compressed test pattern is reduced.

Figure 5:
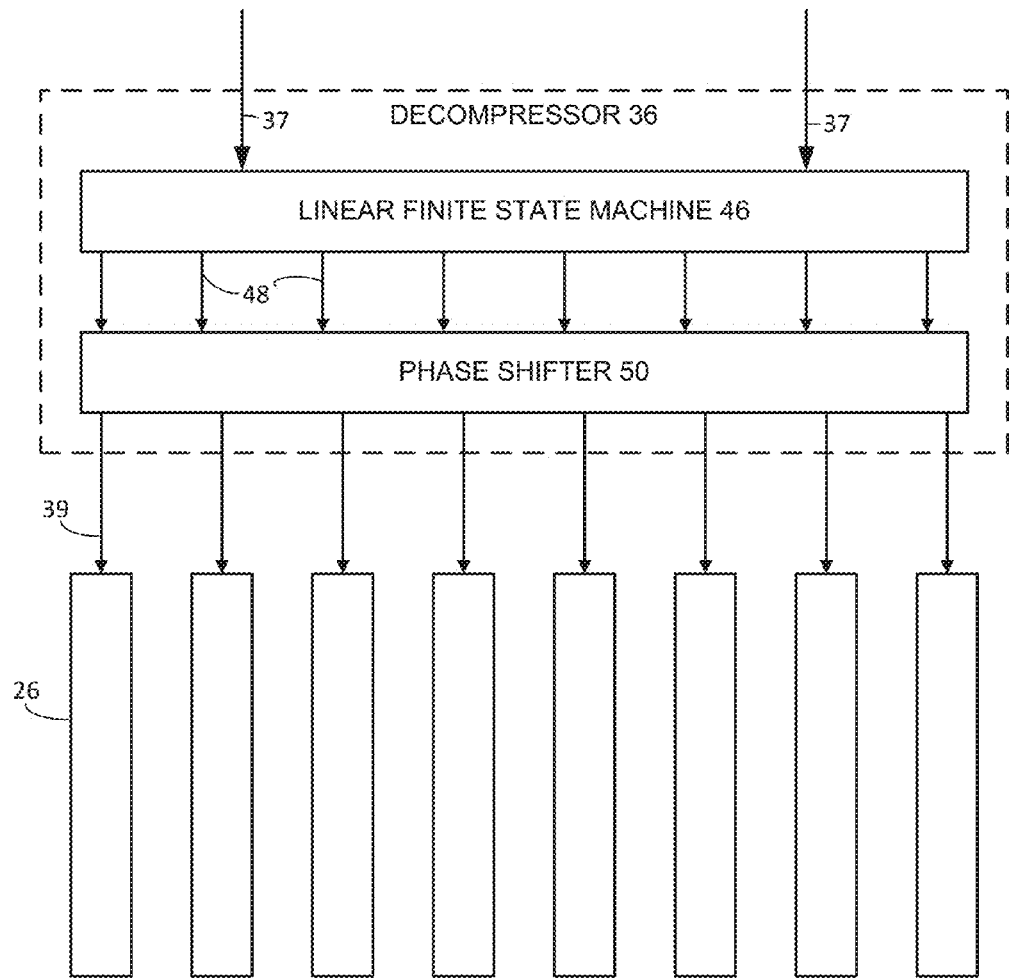
FIG. 5 is a block diagram of a decompressor according to the invention, including a linear finite state machine (LFSM) and phase shifter.

FIG. 5 is a block diagram of a decompressor according to the invention. In a preferred embodiment, decompressor 36 comprises a linear finite state machine (LFSM) 46 coupled, if desired, through its taps 48 to a phase shifter 50. The LFSM through the phase shifter provides highly linearly independent test patterns to the inputs of numerous scan chains in the CUT 24. The LFSM can be built on the basis of the canonical forms of linear feedback shift registers, cellular automata, or transformed LFSRs that can be obtained by applying a number of m-sequence preserving transformations. The output of the LFSM is applied to the phase shifter, which ensures that the decompressed pattern bits present within each of the multiple scan chains 26 at any given time do not overlap in pattern (i.e., are out of phase).

The concept of continuous flow decompression described herein rests on the fact noted above that deterministic test patterns typically have only between 2 to 5% of bits deterministically specified, with the remaining bits randomly filled during test pattern generation. (Test patterns with partially specified bit positions are called test cubes, an example of which appears in Table 2.) These partially specified test cubes are compressed so that the test data volume that has to be stored externally is significantly reduced. The fewer the number of specified bits in a test cube, the better is the ability to encode the information into a compressed pattern. The ability to encode test cubes into a compressed pattern is exploited by having a few decompressor input channels driving the circuit-under-test, which are viewed by the tester as virtual scan chains. The actual CUT 24, however, has its memory elements connected into a large number of real scan chains. Under these circumstances, even a low-cost tester that has few scan channels and sufficiently small memory for storing test data can drive the circuit externally.

Figure 6:
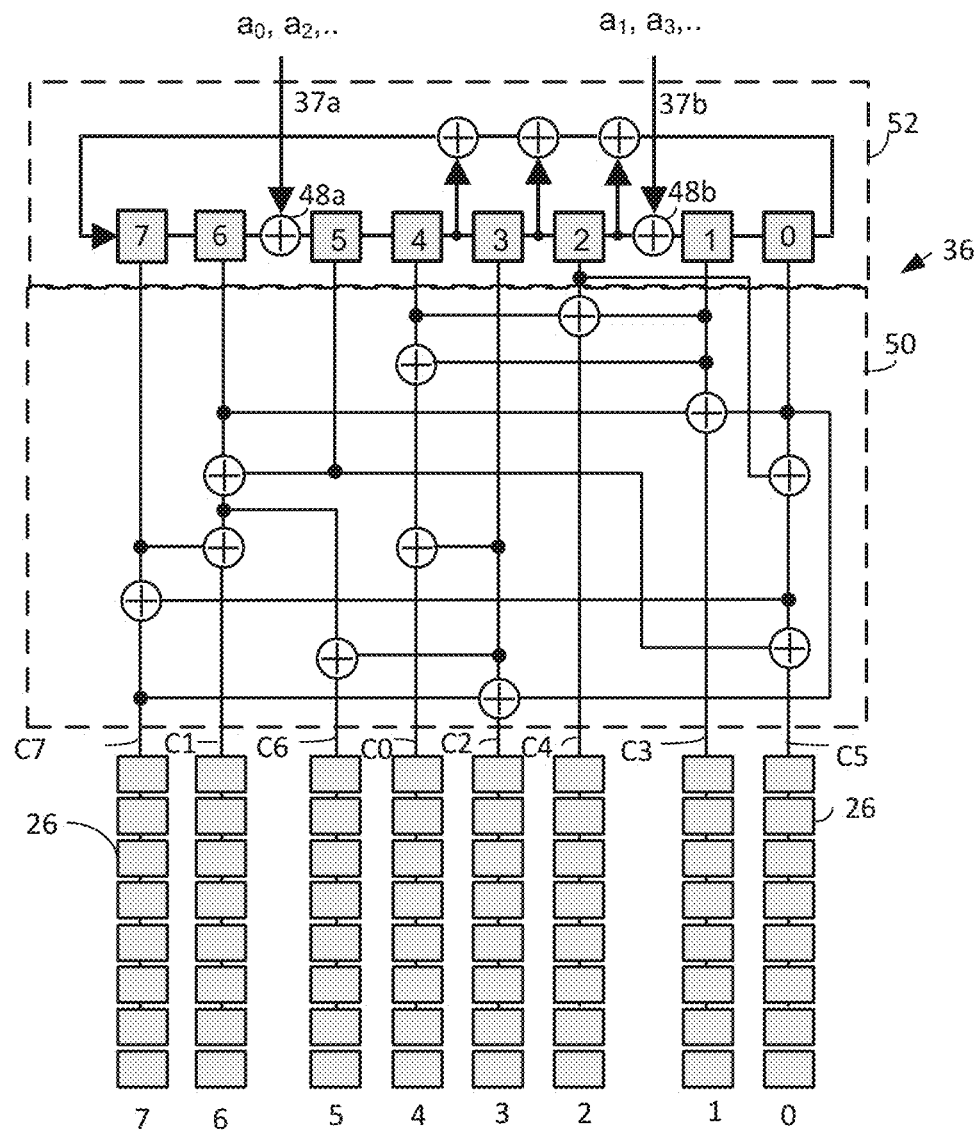
FIG. 6 shows in more detail a first embodiment of the decompressor of FIG. 5 coupled to a scan chain.

FIG. 6 shows in more detail a first embodiment of the decompressor of FIG. 5. The LFSM is embodied in an eight stage Type 1 LFSR 52 implementing primitive polynomial $h(x) = x^8 + x^4 + x^3 + x^2 + 1$. The phase shifter 50, embodied in a number of XOR gates, drives eight scan chains 26, each eight bits long. The structure of the phase shifter is selected in such a way that a mutual separation between its output channels C0-C7 is at least eight bits, and all output channels are driven by 3-input (tap) XOR functions having the following forms:

TABLE 1

$$C_0 = s_4 \oplus s_3 \oplus s_1$$
$$C_1 = s_7 \oplus s_6 \oplus s_5$$
$$C_2 = s_7 \oplus s_3 \oplus s_2$$
$$C_3 = s_6 \oplus s_1 \oplus s_0$$
$$C_4 = s_4 \oplus s_2 \oplus s_1$$
$$C_5 = s_5 \oplus s_2 \oplus s_0$$
$$C_6 = s_6 \oplus s_5 \oplus s_3$$
$$C_7 = s_7 \oplus s_2 \oplus s_0$$

where $C_i$ is the ith output channel and $s_k$ indicates the kth stage of the LFSR. Assume that the LFSR is fed every clock cycle through its two input channels 37a, 37b and input injectors 48a, 48b (XOR gates) to the second and the sixth stages of the register. The input variables "a" (compressed test pattern bits) received on channel 37a are labeled with even subscripts ($a_0$, $a_2$, $a_4$, . . . ) and the variables "a" received on channel 37b are labeled with odd subscripts ($a_1$, $a_3$, $a_5$, . . . ). Treating these external variables as Boolean, all scan cells can be conceptually filled with symbolic expressions being linear functions of input variables injected by tester 21 into the LFSR 52. Given the feedback polynomial, the phase shifter 50, the location of injectors 48a, b as well as an additional initial period of four clock cycles during which only the LFSR is supplied by test data, the contents of each scan cell within the scan chains 26 in FIG. 6 can be logically determined. FIG. 7 gives the expressions for the 64 scan cells in FIG. 6, with the scan chains numbered 0 through 7 in FIG. 6 corresponding to the scan chains C7, C1, C6, . . . identified in FIG. 6. The expressions for each scan chain in FIG. 7 are listed in the order in which the information is shifted into the chain, i.e., the topmost expression represents the data shifted in first.

Assume that the decompressor 36 in FIG. 6 is to generate a test pattern based on the following partially specified test cube in Table 2 (the contents of the eight scan chains are shown here horizontally, with the leftmost column representing the information that is shifted first into the scan chains):

TABLE 2

| | |
|---|---|
| x x x x x x x x | scan chain 0 |
| x x x x x x x x | scan chain 1 |
| x x x x 1 1 x x | scan chain 2 |
| x x 0 x x x 1 x | scan chain 3 |
| x x x x 0 x x 1 | scan chain 4 |
| x x 0 x 0 x x x | scan chain 5 |
| x x 1 x 1 x x x | scan chain 6 |
| x x x x x x x x | scan chain 7 |

The variable x denotes a "don't care" condition. Then a corresponding compressed test pattern can be determined by solving the following system of ten equations from FIG. 7 using any of a number of well-known techniques such as Gauss-Jordan elimination techniques. The selected equations correspond to the deterministically specified bits:

TABLE 3

$a_2 \oplus a_6 \oplus a_{11} = 1$
$a_0 \oplus a_1 \oplus a_4 \oplus a_8 \oplus a_{13} = 1$
$a_4 \oplus a_5 \oplus a_9 \oplus a_{11} = 0$
$a_0 \oplus a_2 \oplus a_5 \oplus a_{12} \oplus a_{13} \oplus a_{17} \oplus a_{19} = 1$
$a_1 \oplus a_2 \oplus a_4 \oplus a_5 \oplus a_6 \oplus a_8 \oplus a_{12} \oplus a_{15} = 0$
$a_0 \oplus a_1 \oplus a_3 \oplus a_5 \oplus a_7 \oplus a_8 \oplus a_{10} \oplus a_{11} \oplus a_{12} \oplus a_{14} \oplus a_{18} \oplus a_{21} = 1$
$a_2 \oplus a_3 \oplus a_4 \oplus a_9 \oplus a_{10} = 0$
$a_0 \oplus a_1 \oplus a_2 \oplus a_6 \oplus a_7 \oplus a_8 \oplus a_{13} \oplus a_{14} = 0$
$a_3 \oplus a_4 \oplus a_5 \oplus a_6 \oplus a_{10} = 1$
$a_0 \oplus a_1 \oplus a_3 \oplus a_7 \oplus a_8 \oplus a_9 \oplus a_{10} \oplus a_{14} = 1$ It can be verified that the resulting seed variables $a_0$, $a_1$, $a_2$, $a_3$ and $a_{13}$ are equal to the value of one while the remaining variables assume the value of zero. This seed will subsequently produce a fully specified test pattern in the following form (the initial specified positions are underlined):

TABLE 4

| | | | | | | | |
|---|---|---|---|---|---|---|---|
| 1 | 0 | 1 | 0 | 0 | 1 | 0 | 0 |
| 1 | 1 | 0 | 0 | 0 | 1 | 0 | 0 |
| 1 | 1 | 1 | 1 | <u>1</u> | <u>1</u> | 1 | 0 |
| 0 | 0 | <u>0</u> | 1 | 0 | 0 | <u>1</u> | 1 |
| 1 | 0 | 1 | 0 | <u>0</u> | 0 | 0 | <u>1</u> |
| 1 | 1 | <u>0</u> | 1 | <u>0</u> | 0 | 0 | 0 |
| 1 | 1 | <u>1</u> | 1 | <u>1</u> | 1 | 1 | 1 |
| 0 | 1 | 0 | 0 | 1 | 1 | 0 | 0 |

As can be observed, the achieved compression ratio (defined as the number of scan cells divided by the number of compressed pattern bits) is 64/(2×8+2×4)≈2.66. The fully specified test pattern is then compressed into a compressed pattern of bits using any of a number of known methods.

Figure 8A:
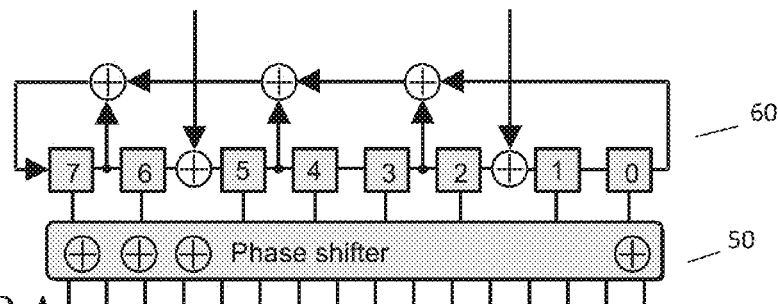
FIGS. 8A-8D illustrate alternative embodiments of the LFSM of FIG. 5.
Figure 8B:
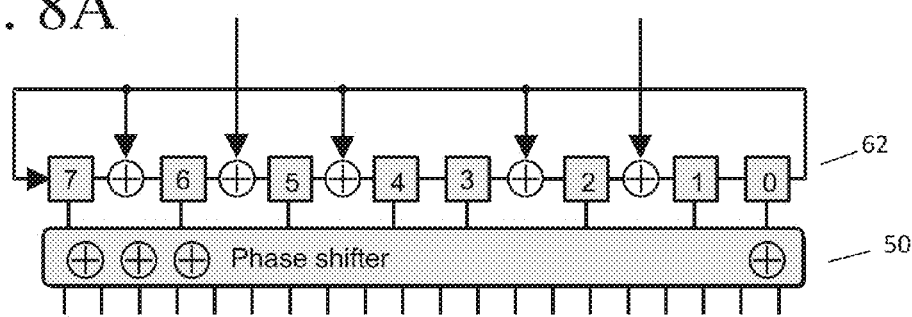
Figure 8C:
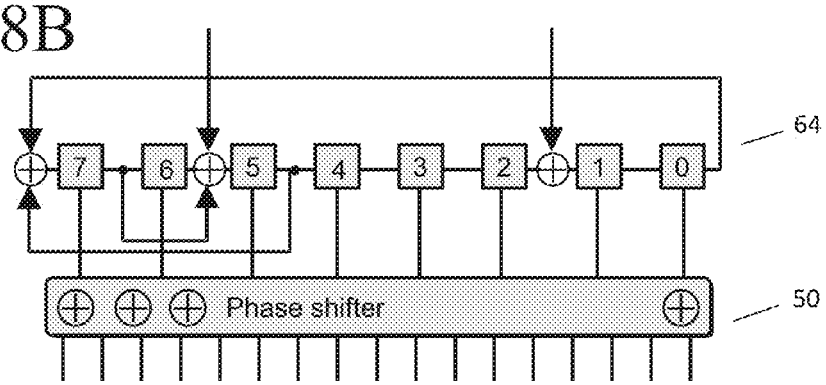
Figure 8D:
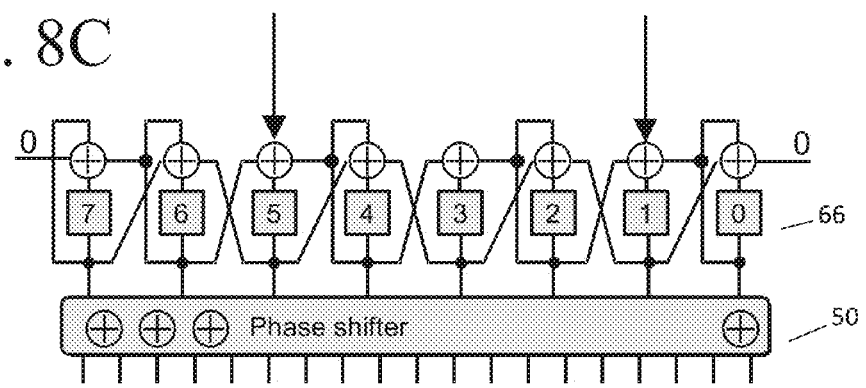

FIGS. 8A-D illustrate various embodiments for the LFSM 46 of FIG. 5. FIG. 8A is a Type I LFSR 60. FIG. 8B is a Type II LFSR 62. FIG. 8C is a transformed LFSR 64. And FIG. 8D is a cellular automaton 66. All of them implement primitive polynomials. Except for the cellular automaton 66, in each case the LFSM includes a number of memory elements connected in a shift register configuration. In addition, there are several feedback connections between various memory cells that uniquely determine the next state of the LFSM. The feedback connections are assimilated into the design by introducing injectors in the form of XOR gates near the destination memory elements. The input channels 37 provide the bits of a compressed pattern to the LFSM through input injectors 48a, b. The injectors are handled similarly as the other feedback connections within the LFSM except that their sources of bits are the input channels. The input channels 37 may have multiple fan-outs driving different LFSM injectors 48 to improve the encoding efficiency.

Figure 9:
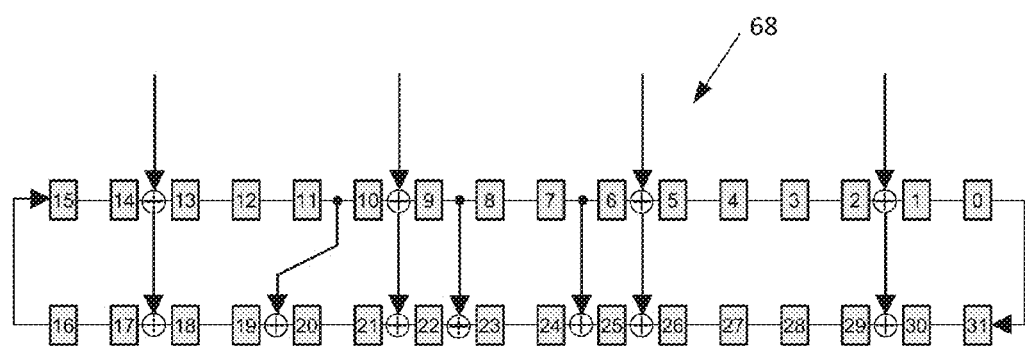
FIG. 9 illustrates a preferred embodiment of a 32-bit LFSM

FIG. 9 shows a preferred embodiment of a 32-bit LFSM in the form of a re-timed LFSR 68. The injectors are spaced equally so that the input variables are distributed optimally once they are injected into the LFSM. In practice, the size of the LFSM depends on the number of real scan chains in a circuit, the desired compression ratio of encoding, and on certain structural properties of the circuit-under-test.

Figure 10:
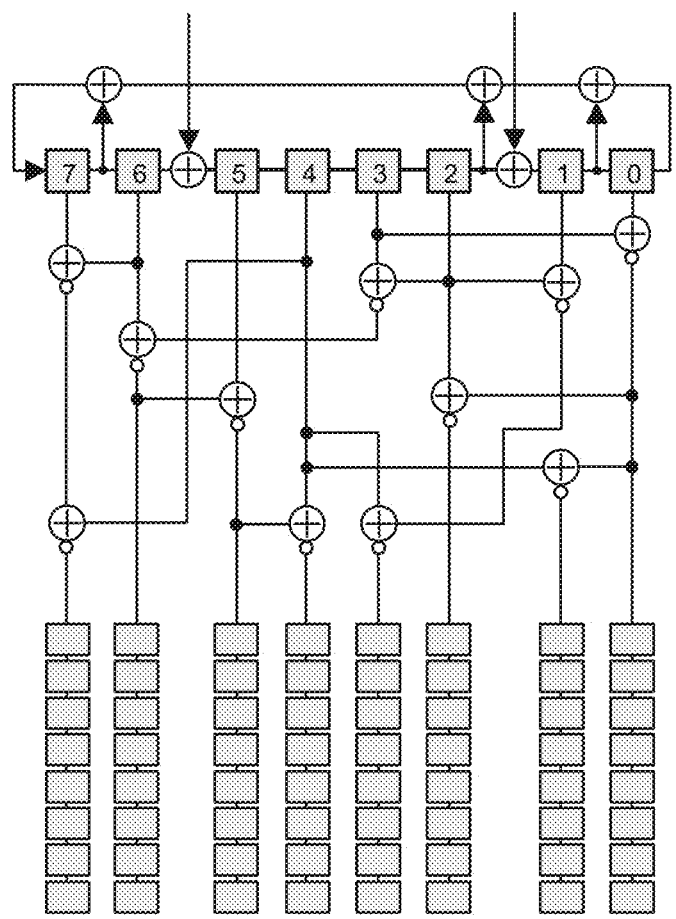
FIG. 10 illustrates an alternative embodiment of the phase shifter of FIG. 5.

FIG. 10 illustrates an alternative embodiment of a phase shifter 50, constructed with an array of XNOR gates rather than XOR gates. Phase shifters can be constructed with combinations of XNOR and XOR gates as well.

Figure 11:
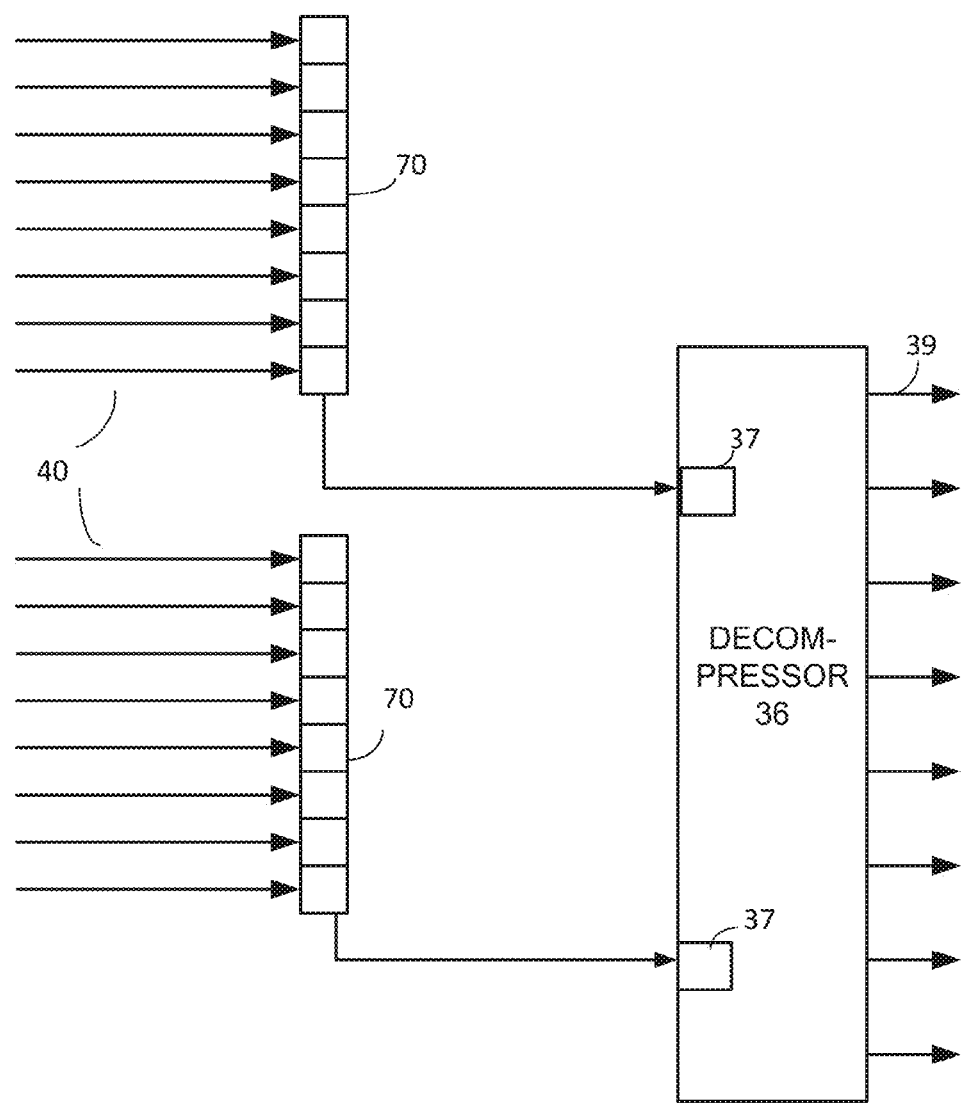
FIG. 11 illustrates the use of parallel-to-serial conversion for applying a compressed test pattern to the decompressor.

FIG. 11 illustrates the use of parallel-to-serial conversion for applying a compressed test pattern to the decompressor. If the input channels 37 to the decompressor 36 are fewer in number than the number of channels 40 of the tester 21, it can be advantageous to provide a parallel-to-serial converter such as registers 70 at the input to the decompressor. The registers 70 are clocked such that their contents are shifted out before the next set of bits is applied to the register from the tester 21. The continuous flow of the test patterns is thus preserved.

Figure 12:
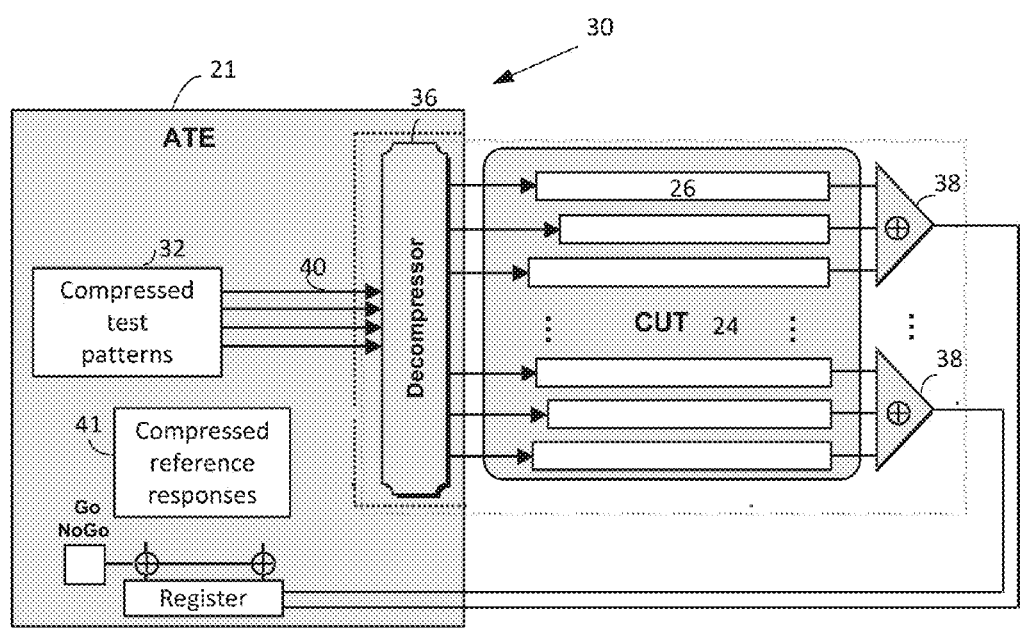
FIG. 12 is a block diagram of a tester according to the invention for testing digital circuits with scan chains.
Figure 13:
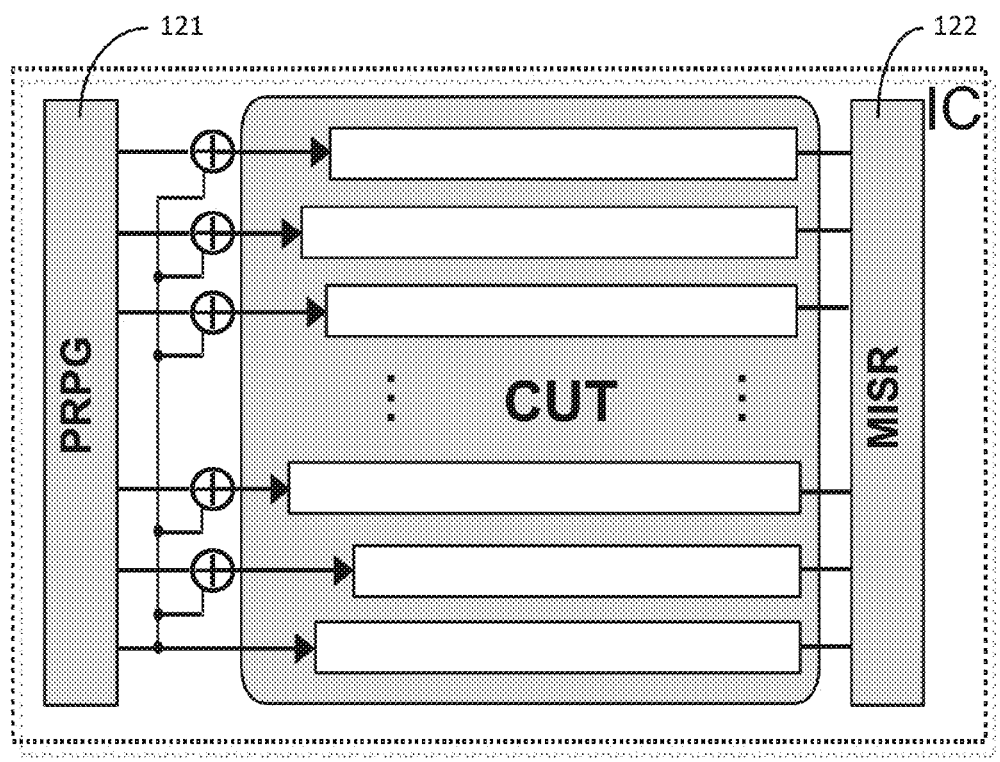
FIG. 13 is a block diagram of a prior art system using a built-in-test system.
Figure 14:
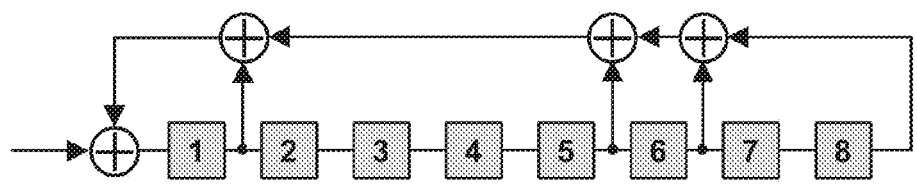
FIG. 14 is a circuit diagram of a prior art type I LFSR compactor.
Figure 15:
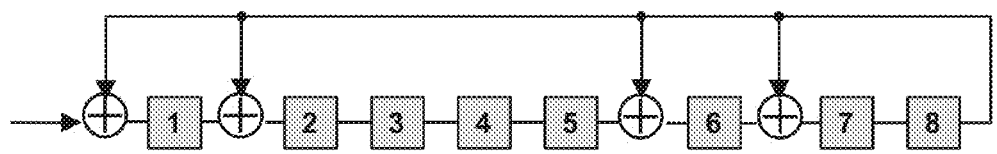
FIG. 15 is a circuit diagram of a prior art type II LFSR compactor.
Figure 16:
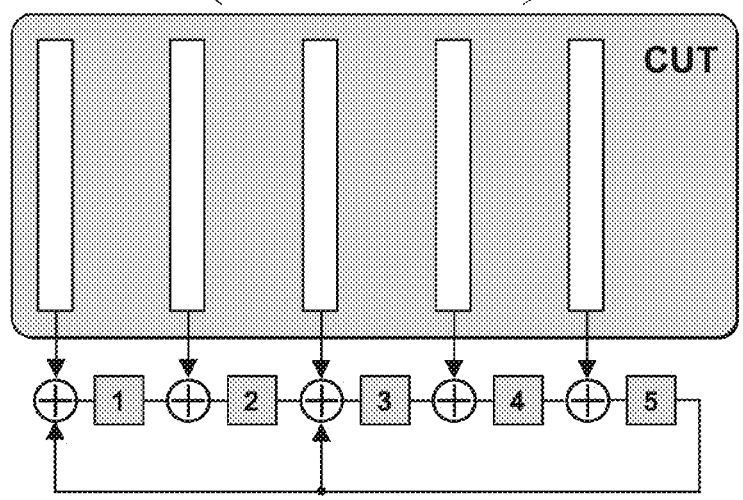
FIG. 16 is a circuit diagram of a prior art architecture of a multiple input signature register (MISR) compactor shown receiving input from scan chains.
Figure 17:
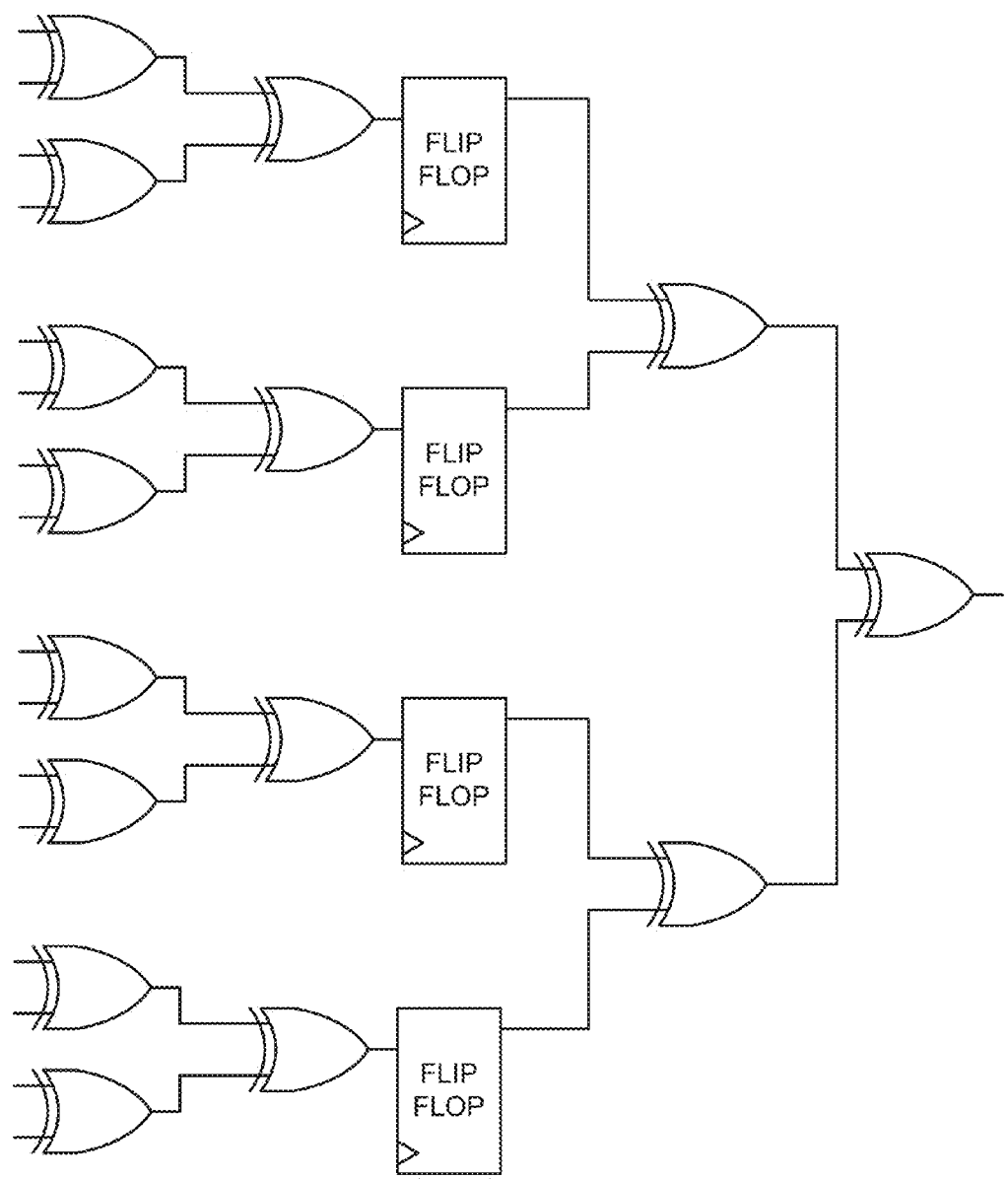
FIG. 17 is a circuit diagram of a prior art pipelined spatial compactor.

FIG. 12 is a block diagram of a tester 21 embodiment that includes the decompressor 36, rather than providing it in the circuit 34. The tester decompresses the test pattern internally and transmits the decompressed test pattern to the CUT 24. Such a tester has advantages where testing time is not as critical and it is preferred not to add a decompressor to each circuit-under-test. Storage requirements are still reduced because compressed test patterns (rather than full test patterns) need only be stored. In addition, in a variation of the above tester embodiment, the compactors 38 can also be included in the tester 21 rather than the circuit 34. The circuit then returns uncompressed test responses to the tester. This further simplifies the circuit's design.

The process of decompressing a test pattern will now be described in more detail, with reference to FIG. 5. The LFSM 46 starts its operation from an initial all-zero state. Assuming an n-bit LFSM and m input injectors, ⌈n/m⌉ clock cycles may be used to initialize the LFSM before it starts generating bits corresponding to the actual test patterns. After initialization of the LFSM and assuming clocks C0 and C1 are running at the same rate, a new bit is loaded in parallel into each scan chain 26 every clock cycle via the phase shifter 50. At this time, the circuit-under-test 34 is operated in the scan mode, so that the decompressed test pattern fills the scan chains 26 with 0s and is (and shifts out any previous test response stored there). A small number of bit positions in the scan chains, therefore, get deterministically specified values while the remaining positions are filled with random bits generated by the LFSM. The number of clock cycles for which a test pattern is shifted is determined by the length of the longest scan chain within the circuit, the number being at least as great as the number of cells in the longest scan chain. A scan-shift signal is therefore held high for all the scan chains until the longest scan chain gets the entire test pattern. The shorter scan chains in the circuit are left justified so that the first few bits that are shifted are overwritten without any loss of information.

Patterns from the LFSM may be linearly dependent. In other words, it is possible to determine various bit positions within the two-dimensional structure of multiple scan chains that are significantly correlated. This causes testability problems, as it is often not possible to provide the necessary stimulus for fault excitation to the gates driven by positions that have some form of dependency between them. Consequently, the phase shifter 50 (such as an array of XOR gates or XNOR gates) may be employed at the taps (outputs) of the LFSM to reduce linear dependencies between various bit positions within the scan chains. The XOR logic can be two-level or multi-level depending on the size of the XOR gates. Every scan chain in the CUT 24 is driven by signals that are obtained by XOR-ing a subset of taps 48 from the LFSM. These taps are determined so that the encoding efficiency of the test cubes is still preserved. In addition, the taps are selected in a manner so that all memory cells in the LFSM have approximately equal number of fan-out signals and the propagation delays are suitably optimized. Once a decompressed test pattern is completely loaded into the scan chains during test mode, the CUT 24 is switched to the normal mode of operation. The CUT then performs its normal operation under the stimulus provided by the test pattern in the scan chains. The test response of the CUT is captured in the scan chains. During the capture the LFSM is reset to the all-zero state before a new initialization cycle begins for loading the next test pattern.

Selectively Compacting Test Responses

Figure 18:
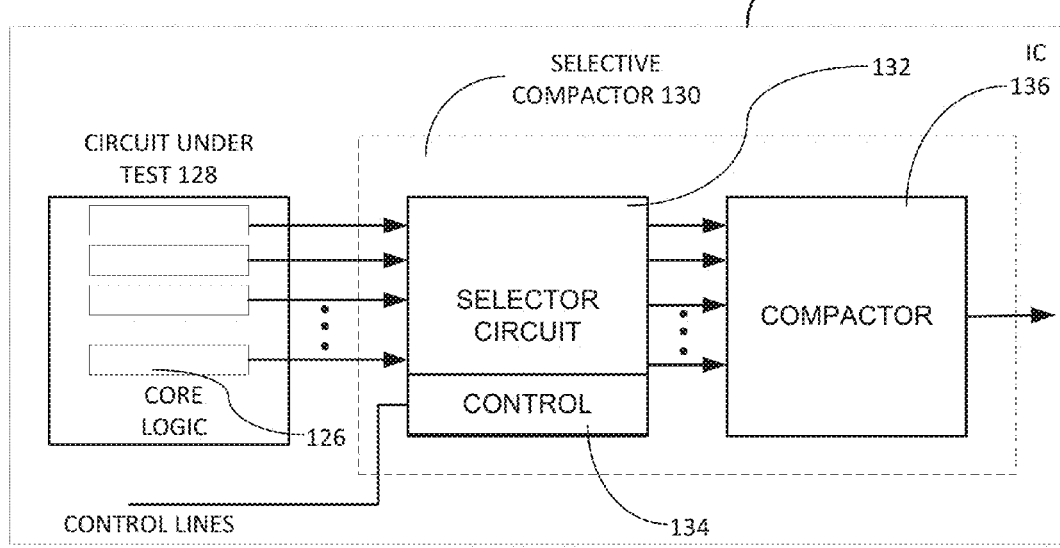
FIG. 18 is a block diagram of a selective compactor according to the invention.

FIG. 18 shows a block diagram of an integrated circuit 124 that includes multiple scan chains 126 in a circuit under test 128. A selective compactor 130 is coupled to the scan chains 126 and includes a selector circuit 132 and a compactor 136. The illustrated system is a deterministic test environment because the scan chains 126 are loaded with predetermined test patterns from an ATE (not shown). The test patterns are applied to the core logic of the integrated circuit to generate test responses, which are also stored in the scan chains 126 (each scan chain contains a test response). The test responses contain information associated with faults in the core logic of the integrated circuit 124. Unfortunately, the test responses may also contain unknown states and/or multiple fault effects, which can negatively impact the effective coverage of the test responses. For example, if a memory cell is not initialized, it may propagate an unknown state to the test response. The test responses are passed to the selector circuit 132 of the selective compactor 130. The selector circuit 132 includes control logic 134 that controls which of the test responses are passed through the selector circuit to the compactor 136. The control logic 134 can control the selector circuit 132 such that test responses with unknown states or multiple fault effects are masked. The control logic is controlled by one or more control lines. Although not shown, the control lines may be connected directly to a channel of an ATE or they may be connected to other logic within the integrated circuit. For example, the control lines may be coupled to a Linear Finite State Machine (e.g., LSFR type 1, LSFR type 2, cellular automata, etc.) in combination with a phase shifter. The compactor 136 receives the desired test responses from the selector circuit 132 and compacts the responses into a compressed output for analysis. The compressed output is compared against a desired output to determine if the circuit under test contains any faults. The selection circuitry, compactor, and circuit under test are all shown within a single integrated circuit. However, the selection circuitry and compactor may be located externally of the integrated circuit, such as within the ATE.

Figure 19:
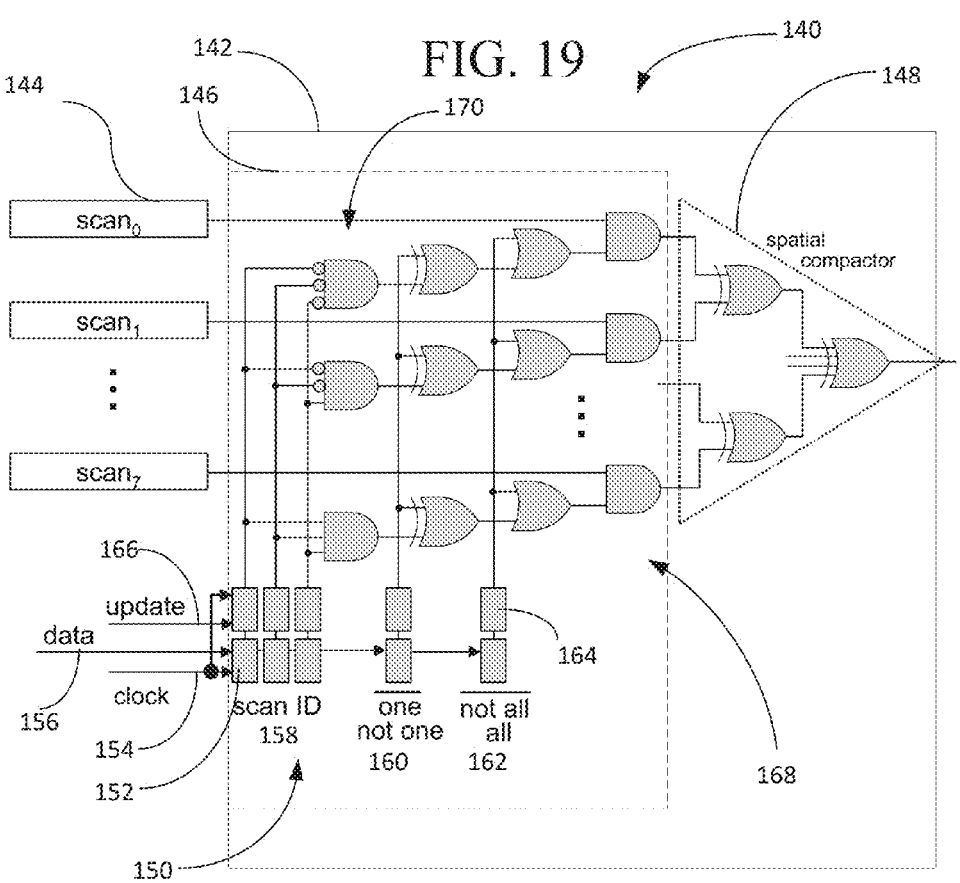
FIG. 19 shows one embodiment of a selective compactor, including selection circuitry and a spatial compactor, for masking test responses from scan chains.

FIG. 19 shows one example of an integrated circuit 140 that includes a selective compactor 142 coupled to multiple scan chains 144 within a circuit under test. Although only 8 scan chains are shown, the test circuit 140 may contain any number of scan chains. The selective compactor 142 includes a selector circuit 146 and a compactor 148. The compactor 148 is a linear spatial compactor, but any conventional parallel test-response compaction scheme can be used with the selector circuit 146, as further described below. The selector circuit 146 includes control logic 150, which includes an input register 152, shown in this example as a shift register. The input register 152 has a clock input 154 and a data input 156. Each cycle of a clock on the clock input 154, data from data input 156 shifts into the input register 152. The register 152 has multiple fields including a scan identification field 158, a "one/not one" field 160 and a "not all/all" field 162. A control register 164 has corresponding bit positions to input register 152, and upon receiving an update signal on an update line 166, the control register 164 loads each bit position from input register 152 in parallel. Thus, the control register 164 also contains fields 158, 160, and 162. Although the control register 164 is shown generically as a shift register, the update line 166 is actually a control line to a multiplexer (not shown) that allows each bit position in register 164 to reload its own data on each clock cycle when the update line deactivated. When the update line is activated, the multiplexer passes the contents of register 152 to corresponding bit positions of the control register 164. The control register 164 is then loaded synchronously with the clock.

The selector circuit 146 includes logic gates, shown generally at 168, coupled to the control register 164. The logic gates 168 are responsive to the different fields 158, 160, 162 of the control register 164. For example, the scan identification field 158 contains a sufficient number of bits to uniquely identify any of the scan chains 144. The scan identification field 158 of the control register 164 is connected to a decoder, shown at 170 as a series of AND gates and inverters. The decoder 170 provides a logic one on a decoder output depending on the scan identification field, while the other outputs of the decoder are a logic zero.

The one/not one field 160 of the control register 164 is used to either pass only one test response associated with the scan chain identified in the scan identification field 158 or pass all of the test responses except for the scan chain identified in the scan identification field. The all/not all field 162 is effectively an override of the other fields. In particular, field 162 controls whether all of the test responses in the scan chains 144 are passed to the compactor 148 or only the test responses as controlled by the scan identification field 158 and the one/not one field 160. With field 162 cleared, only test responses as controlled by the scan identification field 158 and field 160 pass to the compactor 148. Conversely, if the field 162 is set to a logic one, then all of the test responses from all of the scan chains 144 pass to the compactor 148 regardless of the scan identification field 58 and the one/not one field 160.

Figure 20:
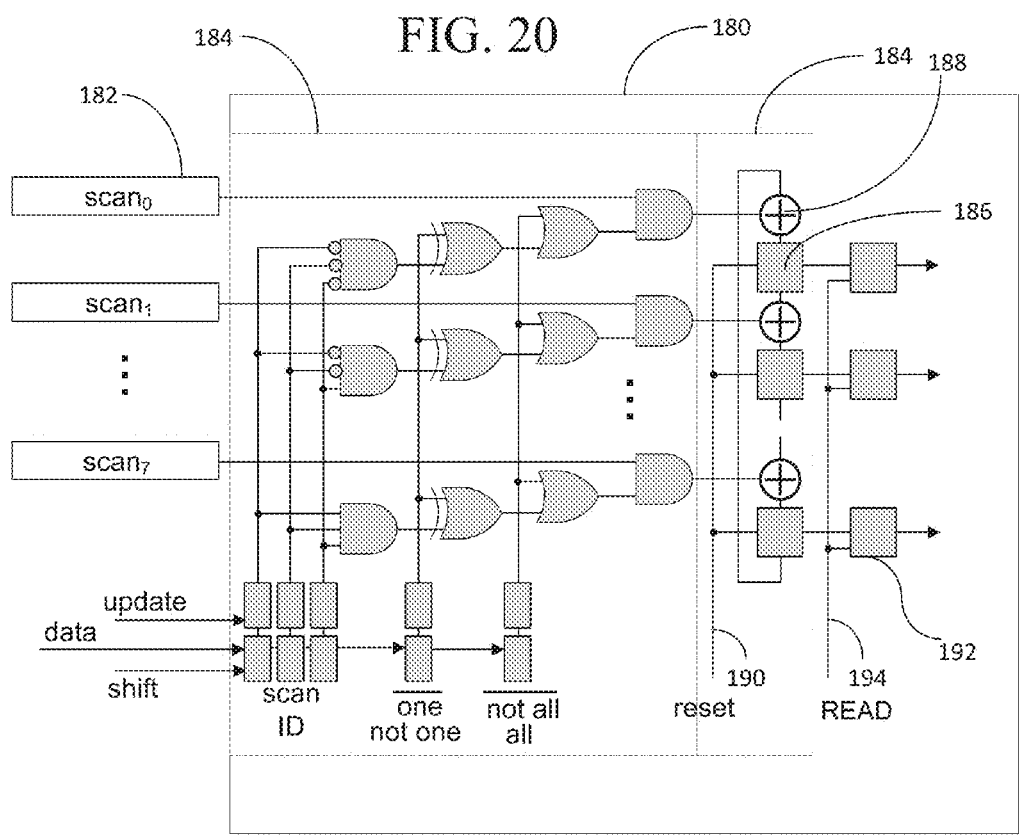
FIG. 20 is another embodiment of a selective compactor including selection circuitry and a time compactor for masking test responses from scan chains.

FIG. 20 shows another embodiment of a selective compactor 180 that is coupled to scan chains 182. The selective compactor includes a selector circuit 184, which is identical to the selector circuit 146 described in relation to FIG. 19. The selective compactor 180 also includes a time compactor 184, which is well understood in the art to be a circular compactor. The time compactor includes multiple flip-flops 186 and XOR gates 188 coupled in series. A reset line 190 is coupled to the flip-flops 186 to reset the compactor 184. The reset line may be reset multiple times while reading the scan chains. Output register 192 provides a valid output of the compactor 84 upon activation of a read line 194.

Referring to both FIGS. 19 and 20, in operation the scan chains 182 are serially loaded with predetermined test patterns by shifting data on scan channels (not shown) from an ATE (not shown). Simultaneously, the input register 152 is loaded with a scan identification and the controlling flags in fields 160, 162. The test patterns in the scan chains 144, 182 are applied to the circuit under test and test responses are stored in the scan chains. Prior to shifting the test responses out of the scan chains, the update line 166 is activated, thus moving fields 158, 160, 162 to the control register 164. The control register thereby controls the logic gates 168 to select the test responses that are passed to the compactors 148, 184. If the field 162 is in a state such that selection is not overridden, then certain of the test responses are masked. In the example of FIG. 19, the spatial compactor 148 provides the corresponding compressed output serially and simultaneously with shifting the test responses out of the scan chains. Conversely, in FIG. 20 the selective compactor 180 does not provide the appropriate compressed output until the read line 194 is activated. The selective compactor 180 provides a parallel compressed output as opposed to serial. The selective compactor 180 may be read multiple times (e.g., every eighth clock cycle) while reading out the test responses.

Figure 21:
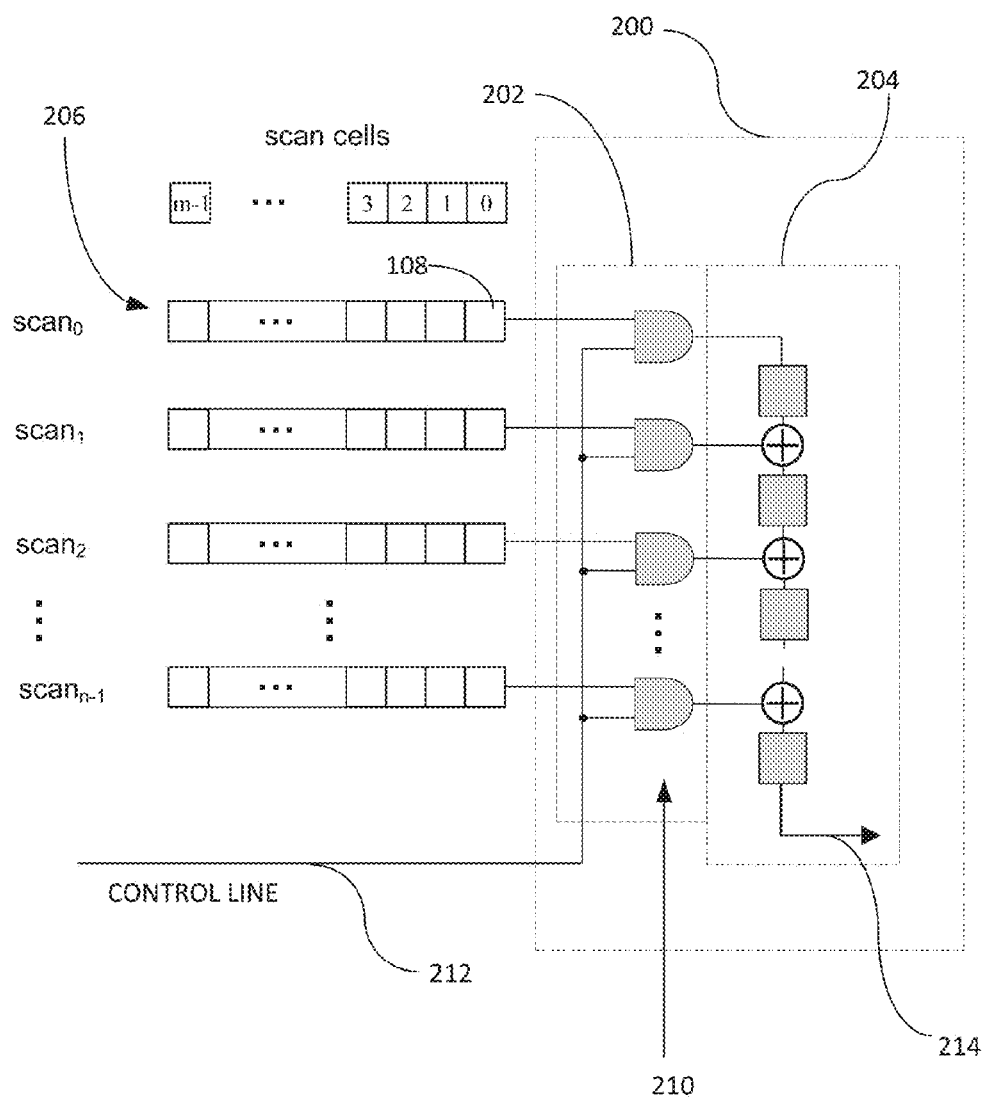
FIG. 21 is yet another embodiment of a selective compactor including selection circuitry and a cascaded compactor for masking individual bits of test responses from scan chains.

FIG. 21 shows another embodiment of a selective compactor 200. Again, the selective compactor includes a selector circuit 202 and a compactor 204. The compactor 204 is a type of spatial compactor called a cascaded compactor. N scan chains 206 include M scan cells 208, each of which stores one bit of the test response. The selector circuit 202 includes logic gates 210, in this case shown as AND gates, coupled to a control line 212. The compactor 204 is a time compactor with a single serial output 214. The control line 212 is used to mask the test responses. In particular, the control line 212 either masks all corresponding scan cells in the scan chains or allows all of the scan cells to pass to the compactor 180. The control line 212 operates to mask each column of scan cells, rather than masking an entire scan chain. Thus, individual bits from any scan chain can be masked on a per clock-cycle basis and the remaining bits of that scan chain applied to the compactor 204. With control line 212 activated, all bits from the scan chains pass to the compactor. With control line 212 deactivated, all bits from the scan chains are masked. Although FIG. 21 shows only a single control line, additional control lines can be used to mask different groups of scan chains. Additionally, although control line 212 is shown as active high, it may be configured as active low.

Figure 22:
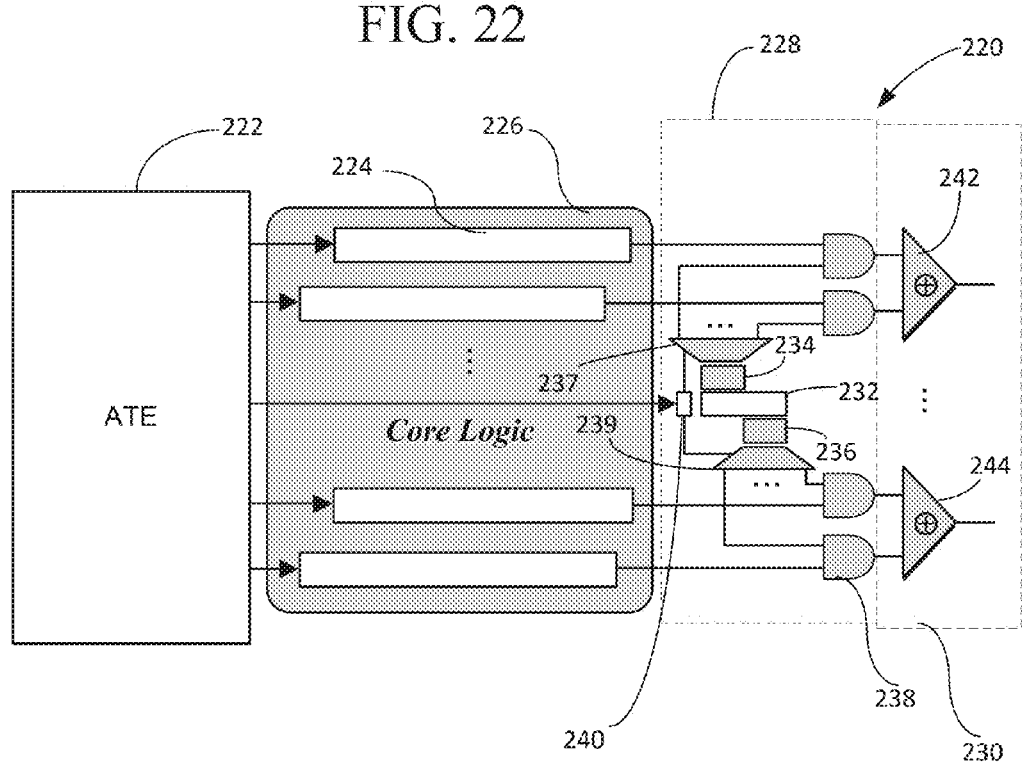
FIG. 22 is another embodiment of a selective compactor including selection circuitry and multiple compactors for masking test responses.

FIG. 22 shows yet another embodiment of the selective compactor 220. Automated test equipment 222 provides test patterns to the scan chains 224. The scan chains 224 are a part of the circuit under test 226. The patterns that are loaded into the scan chains 224 by the ATE are used to detect faults in the core logic of the circuit 226. The test responses are stored in the scan chains 224 and are clocked in serial fashion to the selective compactor 220. The selective compactor includes a selector circuit 228 and a compactor 230. The selector circuit 228 includes control logic including an input register 232, multiple control registers 234, 236, and multiple decoders 237 and 239. The register 232 is loaded with a pattern of bits that are moved to the control registers 234, 236 upon activation of an update line (not shown). The control registers 234, 236 are read by the decoders 237 and 239 and decoded to select one or more logic gates 238. A flag 240 is used to override the decoders 237 and 239 and pass all of the test responses to the compactor 230. Although only a single flag 240 is shown, multiple flags may be used to separately control the decoders. In this example, the compactor 230 includes multiple spatial compactors, such as compactors 242 and 244. Each control register may be loaded with different data so that the compactors 242, 244 can be controlled independently of each other.

Figure 23:
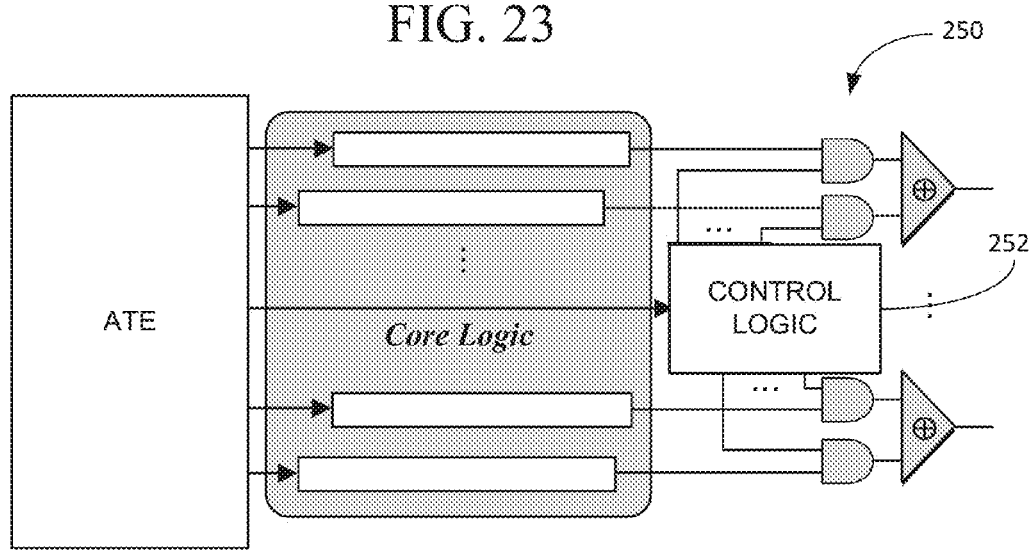
FIG. 23 is another embodiment of a selective compactor with selection circuitry that masks any variable number of test responses from the scan chains.

FIG. 23 shows yet another embodiment of the present invention with a selective compactor 250. Control logic 252 variably controls which test responses are masked and which test responses are compacted. Thus, activating the corresponding bit position in the control logic 252 activates the corresponding logic gate associated with that bit and allows the test response to pass to the compactor. Conversely, any bit that is not activated masks the corresponding test response.

Figure 24:
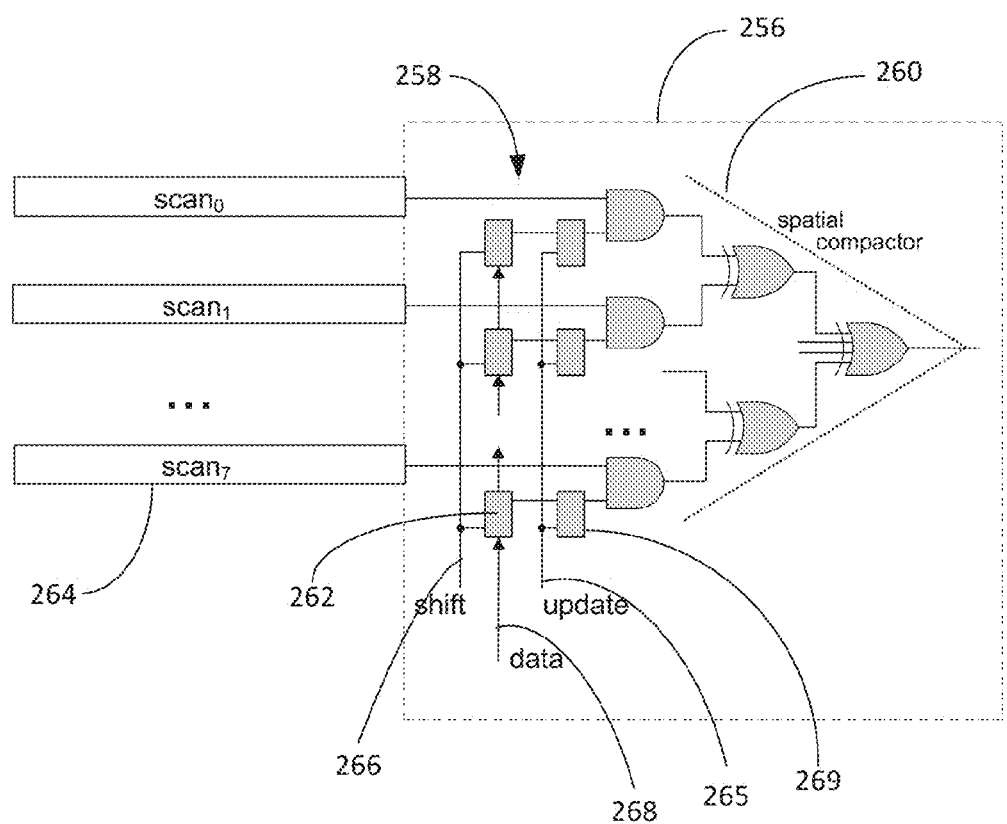
FIG. 24 is another embodiment of a selective compactor with programmable selection of scan chains.

FIG. 24 shows another embodiment of a selective compactor 256 including a selector circuit 258 and compactor 260. In this case, an input shift register 262 having a bit position corresponding to each scan chain 264 is used to selectively mask the scan chains. A clock is applied to line 266 to serially move data applied on data line 268 into the shift register 262. At the appropriate time, an update line 265 is activated to move the data from the shift register to a control register 269. Each bit position that is activated in the control register 269 allows a test response from the scan chains 264 to pass to the compactor. All other test responses are masked. Thus, the selective compactor can mask any variable number of test responses.

Each of the embodiments described above can be used as a diagnostic tool for localizing faults in the circuit under test. For example, each test response can be analyzed individually by masking all other test responses in the scan chains connected to the same compactor. By viewing the test response individually, the bit position in the test response containing fault effects can be determined.

Figure 25:
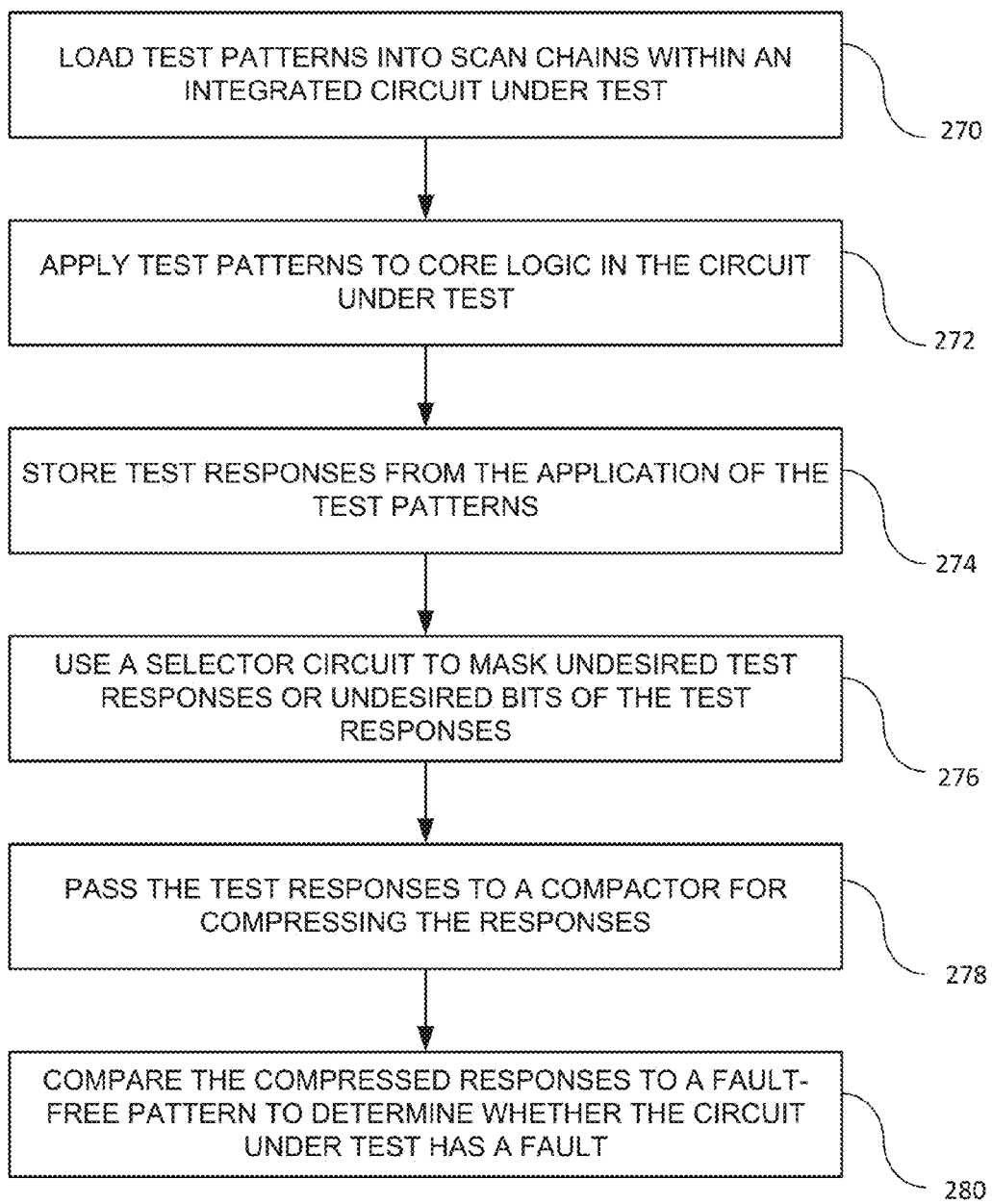
FIG. 25 is a flowchart of a method for selectively compacting test responses from scan chains.

FIG. 25 shows a flowchart of a method for selectively compacting test responses. In process block 270, an ATE loads predetermined test patterns into scan chains within an integrated circuit. This loading is typically accomplished by shifting the test patterns serially into the scan chains. The test patterns are applied to the circuit under test (process block 272) and the test responses are stored in the scan chains (process block 274). In process block 276, the selector circuit controls which test responses are masked. In particular, the selector circuit controls which scan chains are masked or which bits in the scan chains are masked. For example, in FIG. 19, the selector circuit masks the entire scan chain that is identified in the scan identification field 158. In FIG. 21, only individual bits of a scan chain are masked. In any event, in process block 276, the selector circuit typically masks unknown data or multiple fault effects so that the desired fault effect can propagate to the output (in some modes of operation, all of the test responses may pass to the output). In the event that the selector circuit includes a control register, the control register may be loaded concurrently with loading the test patterns in the scan chains or it can be loaded prior to reading the test responses. In process block 278, the test responses (one or more of which have been masked) are passed to the compactor and the compactor generates a compressed output associated with the test responses. In process block 280, the compressed output generated by the compactor is compared to an ideal response. If they match, the integrated circuit is assumed to be fault free.

Having illustrated and described the principles of the illustrated embodiments, it will be apparent to those skilled in the art that the embodiments can be modified in arrangement and detail without departing from such principles. For example, any of the illustrated compactors can be used with any of the illustrated selector circuits with minimum modification to create a selective compactor. Additionally, the selector circuit can easily be modified using different logic gates to achieve the selection functionality. For example, although the update lines are shown coupled to a separate bank of flip flops, the update lines can instead be coupled to input registers having tri-state outputs for controlling the logic in the selector circuit. Still further, although the scan chains are shown as serial shift registers, logic may be added so as to output test response data in parallel to the selective compactor. Additionally, although multiple spatial and time compactors were shown, compactors having features of both spatial and time compactors may be used. Indeed, any conventional or newly developed compactor may be used with the selection circuitry.

In view of the many possible embodiments to which the principles of the invention may be applied, it should be understood that the illustrative embodiment is intended to teach these principles and is not intended to be a limitation on the scope of the invention. We therefore claim as our invention all that comes within the scope and spirit of the following claims and their equivalents.

We claim:

1. A system, comprising:
   a circuit comprising a decompressor, the decompressor comprising a linear feedback shift register (LFSR); and
   automatic testing equipment located external to the circuit,
   wherein the decompressor is configured to load compressed test pattern data from an output of the automatic testing equipment through an input logic gate of the LFSR, the input logic gate of the LFSR being configured to receive the compressed test pattern data and logically combine the compressed test pattern data with data stored within the LFSR concurrently as the decompressor outputs decompressed test pattern data.

2. The system of claim 1, wherein the decompressor is configured to receive multiple compressed test pattern bits in parallel from multiple outputs of the automatic testing equipment through multiple input gates of the LFSR.

3. The system of claim 1, wherein the decompressor further includes a phase shifter having inputs coupled to outputs of the LFSR, the phase shifter being configured such that test pattern bits output from the phase shifter are out of phase with one another.

4. The system of claim 1, wherein the circuit further includes scan chains and wherein the decompressor further includes a phase shifter coupled between the LFSR and the scan chains, the phase shifter being configured such that test pattern bits output from the phase shifter are out of phase with one another.

5. The system of claim 4, wherein the circuit further comprises an XOR tree coupled to two or more outputs of the scan chains.

6. The system of claim 4, wherein the circuit further comprises a compactor coupled to outputs of the scan chains.

7. The system of claim 6, wherein the compactor comprises an XOR tree.

8. The system of claim 1, wherein the circuit further comprises scan chains configured to receive decompressed test pattern bits from the decompressor.

9. The system of claim 8, wherein the circuit further comprises a compactor coupled to outputs of the scan chains.

10. The system of claim 9, wherein the compactor comprises an XOR tree.

11. The system of claim 1, wherein the input logic gate is an XOR gate.

* * * * *